United States Patent
Ohnuma et al.

(10) Patent No.: US 8,313,989 B2
(45) Date of Patent: Nov. 20, 2012

(54) SOI SUBSTRATE AND METHOD FOR MANUFACTURING THE SAME

(75) Inventors: Hideto Ohnuma, Atsugi (JP); Eiji Higa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 138 days.

(21) Appl. No.: 12/580,532

(22) Filed: Oct. 16, 2009

(65) Prior Publication Data

US 2010/0096720 A1 Apr. 22, 2010

(30) Foreign Application Priority Data

Oct. 22, 2008 (JP) ................. 2008-271676

(51) Int. Cl.
*H01L 21/84* (2006.01)
*H01L 21/331* (2006.01)
*H01L 21/76* (2006.01)
*H01L 21/46* (2006.01)

(52) U.S. Cl. ........ 438/149; 438/166; 438/311; 438/406; 438/458; 257/E21.32; 257/E21.561

(58) Field of Classification Search ............... 438/149, 438/166, 311, 406, 458; 257/E21.32, E21.561
See application file for complete search history.

(56) References Cited

U.S. PATENT DOCUMENTS

| | | | |
|---|---|---|---|
| 4,460,670 A | 7/1984 | Ogawa et al. | |
| 4,766,477 A | 8/1988 | Nakagawa et al. | |
| 5,374,564 A | 12/1994 | Bruel | |
| 5,643,826 A | 7/1997 | Ohtani et al. | |
| 5,923,962 A | 7/1999 | Ohtani et al. | |
| 6,285,042 B1 | 9/2001 | Ohtani et al. | |
| 6,335,231 B1 | 1/2002 | Yamazaki et al. | |
| 6,335,541 B1 | 1/2002 | Ohtani et al. | |
| 6,375,738 B1 * | 4/2002 | Sato ........................ | 117/89 |
| 6,380,046 B1 | 4/2002 | Yamazaki | |

(Continued)

FOREIGN PATENT DOCUMENTS

EP 0 651 431 5/1995

(Continued)

OTHER PUBLICATIONS

Wolf et al., Silicon Processing for the VLSI ERA, vol. 1, 1986, pp. 59-61.

*Primary Examiner* — Ngan Ngo
(74) *Attorney, Agent, or Firm* — Eric J. Robinson; Robinson Intellectual Property Law Office, P.C.

(57) ABSTRACT

To provide an SOI substrate having a high mechanical strength, and a method for manufacturing the SOI substrate, a single crystal semiconductor substrate is irradiated with accelerated ions so that an embrittled region is formed in a region at a predetermined depth from a surface of the single crystal semiconductor substrate; the single crystal semiconductor substrate is bonded to a base substrate with an insulating layer interposed therebetween; the single crystal semiconductor substrate is heated to be separated along the embrittled region, so that a semiconductor layer is provided over the base substrate with the insulating layer interposed therebetween; and a surface of the semiconductor layer is irradiated with a laser beam so that at least a superficial part of the semiconductor layer is melted, whereby at least one of nitrogen, oxygen, and carbon is solid-dissolved in the semiconductor layer.

18 Claims, 13 Drawing Sheets

U.S. PATENT DOCUMENTS

| | | |
|---|---|---|
| 6,444,506 B1 | 9/2002 | Kusumoto et al. |
| 6,534,380 B1 | 3/2003 | Yamauchi et al. |
| 6,677,222 B1 | 1/2004 | Mishima et al. |
| 6,803,264 B2 | 10/2004 | Yamazaki et al. |
| 6,803,296 B2 | 10/2004 | Miyairi |
| 6,998,639 B2 | 2/2006 | Ohtani et al. |
| 7,153,729 B1 | 12/2006 | Yamazaki et al. |
| RE39,484 E | 2/2007 | Bruel |
| 7,199,024 B2 | 4/2007 | Yamazaki |
| 7,253,032 B2 | 8/2007 | Yamazaki et al. |
| 7,485,586 B2 | 2/2009 | Yamazaki et al. |
| 7,745,268 B2 * | 6/2010 | Miyairi ........................ 438/149 |
| 7,943,414 B2 | 5/2011 | Shimomura et al. |
| 2002/0109144 A1 | 8/2002 | Yamazaki |
| 2002/0137265 A1 | 9/2002 | Yamazaki et al. |
| 2003/0183876 A1 | 10/2003 | Takafuji et al. |
| 2004/0147095 A1 | 7/2004 | Yamazaki |
| 2005/0009252 A1 | 1/2005 | Yamazaki et al. |
| 2006/0131583 A1 | 6/2006 | Ohtani et al. |
| 2006/0278876 A1 | 12/2006 | Yamazaki et al. |
| 2007/0117288 A1 | 5/2007 | Miyairi |
| 2007/0173000 A1 | 7/2007 | Yamazaki |
| 2007/0184632 A1 | 8/2007 | Yamazaki et al. |
| 2008/0054269 A1 | 3/2008 | Yamazaki et al. |
| 2008/0061301 A1 | 3/2008 | Yamazaki |
| 2008/0067529 A1 | 3/2008 | Yamazaki |
| 2008/0067596 A1 | 3/2008 | Yamazaki et al. |
| 2008/0067597 A1 | 3/2008 | Yamazaki |
| 2008/0070335 A1 | 3/2008 | Yamazaki et al. |
| 2008/0083953 A1 | 4/2008 | Yamazaki |
| 2008/0113487 A1 | 5/2008 | Yamazaki et al. |
| 2008/0113488 A1 | 5/2008 | Yamazaki et al. |
| 2008/0213953 A1 | 9/2008 | Yamazaki |
| 2008/0261379 A1 * | 10/2008 | Jinbo et al. .................... 438/458 |
| 2008/0286911 A1 | 11/2008 | Miyairi |
| 2008/0299743 A1 | 12/2008 | Miyairi |
| 2008/0315350 A1 | 12/2008 | Tanaka |
| 2009/0004821 A1 | 1/2009 | Shimomura et al. |
| 2009/0029525 A1 | 1/2009 | Ohnuma |
| 2009/0093102 A1 | 4/2009 | Moriwaka |
| 2009/0098710 A1 | 4/2009 | Yamazaki |
| 2009/0115029 A1 | 5/2009 | Koyama et al. |
| 2009/0117680 A1 | 5/2009 | Yamazaki et al. |
| 2009/0142874 A1 | 6/2009 | Arai |
| 2009/0181552 A1 | 7/2009 | Shimomura et al. |
| 2009/0230503 A1 | 9/2009 | Shimomura et al. |
| 2009/0298261 A1 * | 12/2009 | Endo et al. .................... 438/458 |
| 2010/0084734 A1 * | 4/2010 | Momo et al. .................. 257/506 |
| 2010/0173473 A1 * | 7/2010 | Jinbo et al. .................... 438/458 |
| 2011/0151650 A1 * | 6/2011 | Murphy et al. ............... 438/481 |
| 2011/0212596 A1 * | 9/2011 | Shimomura et al. .......... 438/458 |

FOREIGN PATENT DOCUMENTS

| | | |
|---|---|---|
| JP | 58-070536 | 4/1983 |
| JP | 05-211128 | 8/1993 |
| JP | 07-130652 | 5/1995 |
| JP | 11-097379 | 4/1999 |
| JP | 2000-012864 | 1/2000 |
| JP | 2000-150905 | 5/2000 |
| JP | 2000-294754 | 10/2000 |
| JP | 2001-223175 | 8/2001 |
| JP | 2005-203596 | 7/2005 |
| JP | 2005-252244 | 9/2005 |

* cited by examiner

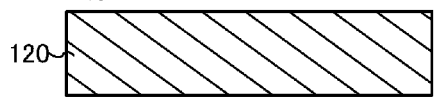
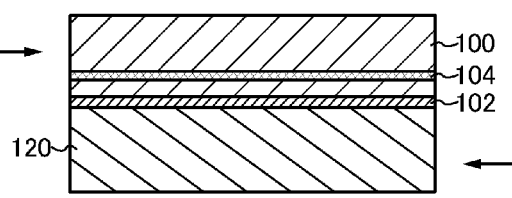
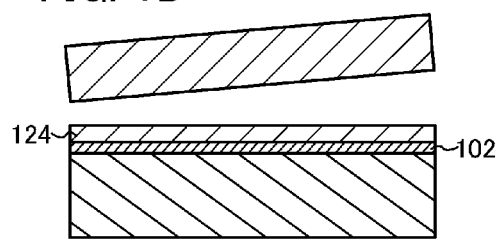
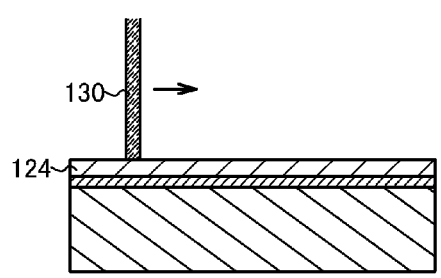

_US 8,313,989 B2_

SOI SUBSTRATE AND METHOD FOR MANUFACTURING THE SAME

BACKGROUND OF THE INVENTION

1. Field of the Invention

The present invention relates to a substrate in which a single crystal semiconductor layer is provided on an insulating layer, and a method for manufacturing the substrate. In particular, the present invention relates to an SOI (silicon on insulator) substrate and a method for manufacturing the same. Furthermore, the present invention relates to a semiconductor device formed using an SOI substrate and a method for manufacturing the same.

2. Description of the Related Art

In recent years, devices such as semiconductor integrated circuits, which use an SOI substrate including a thin single crystal semiconductor layer formed on an insulating surface, have been developed instead of those using a bulk silicon wafer. Since the parasitic capacitance between a drain of a transistor and a substrate is reduced by using an SOI substrate, SOI substrates have attracted attention as substrates for improving the performance of devices.

One of the known methods for manufacturing an SOI substrate is Smart Cut (registered trademark) method (see Patent Document 1, for example). An outline of the method for manufacturing an SOI substrate by Smart Cut (registered trademark) method is described below. First, hydrogen ions are implanted into a silicon wafer by an ion implantation method so that an embrittled region including a defect is formed at a predetermined depth from a surface. Then, the silicon wafer into which hydrogen ions have been implanted is bonded to another silicon wafer with a silicon oxide film interposed therebetween. After that, heat treatment is performed so that a part of the silicon wafer into which hydrogen ions have been implanted is separated in a thin film shape along the embrittled region. Thus, a single crystal silicon film can be obtained over the other bonded silicon wafer. Smart Cut (registered trademark) method is also referred to as a hydrogen ion implantation separation method.

A method has also been proposed in which a single crystal silicon layer is formed over a base substrate made of glass by such Smart Cut (registered trademark) method (see Patent Document 2, for example). Glass substrates can have a larger area and are less expensive than silicon wafers, and thus are mainly used for manufacturing liquid crystal display devices and the like. By using a glass substrate as a base substrate, a large, inexpensive SOI substrate can be manufactured.

[Reference]

[Patent Document]

[Patent Document 1] Japanese Published Patent Application No. H05-211128

[Patent Document 2] Japanese Published Patent Application No. 2005-252244

SUMMARY OF THE INVENTION

In the case where a large-sized device such as a display or a device having a curvature is formed using, for example, a single crystal silicon layer formed on an insulating substrate such as a glass substrate as disclosed in Patent Document 2, a poor mechanical strength of the single crystal silicon layer due to its reduced thickness has been a problem. The poor mechanical strength of the single crystal silicon layer with a reduced thickness might cause cracks and breaking of the single crystal silicon layer in the manufacture or use of the device. In addition, there has been a problem in that linear defects (dislocations) or planar defects occur or grow, and even when a transistor is formed using the single crystal silicon layer, characteristics of the transistor are deteriorated.

In view of the foregoing problem, one object of the present invention is to provide an SOI substrate having a high mechanical strength.

It is generally said that mechanical strength increases as the impurity concentration in bulk silicon, specifically, the concentration of nitrogen, oxygen, carbon, or the like in bulk silicon increases. As bulk silicon widely used for industries, for example, there is bulk silicon manufactured by a Czochralski (CZ) method or a floating zone (FZ) method.

A single crystal semiconductor ingot or a single crystal semiconductor wafer manufactured by the CZ method contains oxygen at a concentration of $1\times10^{17}$ atoms/cm$^3$ to $1\times10^{18}$ atoms/cm$^3$, and the concentrations of nitrogen and carbon are $4\times10^{15}$ atoms/cm$^3$ or less and $2\times10^{16}$ atoms/cm$^3$ or less, respectively, even though they are added intentionally. The impurity concentration in a single crystal semiconductor ingot manufactured by the FZ method is generally lower than that in a single crystal semiconductor ingot manufactured by the CZ method; therefore, the single crystal semiconductor ingot manufactured by the FZ method has a problem of a poor mechanical strength to be easily broken. On the other hand, since the impurity concentration in bulk silicon manufactured by the CZ method is higher than that in bulk silicon manufactured by the FZ method, bulk silicon manufactured by the CZ method has a higher mechanical strength.

However, when an ingot is manufactured by the CZ method, a high concentration of nitrogen, oxygen, carbon, or the like might be contained in the ingot during a manufacturing process because of a long melting step and a long cooling step with pulling up the ingot. Then, nitrogen, oxygen, carbon, or the like is precipitated to produce a huge defect, which reduces the mechanical strength of the ingot. Accordingly, in order to obtain an SOI substrate having a high mechanical strength, it is preferable that nitrogen, oxygen, carbon, or the like be not contained at a high concentration during the manufacturing of a single crystal silicon ingot, and the concentration of nitrogen or the like in single crystal silicon be controlled to be within a suitable range after long-time melting heat treatment.

In view of the foregoing problem, another object of the present invention is to provide a method for manufacturing an SOI substrate with a high mechanical strength.

In addition, if nitrogen, oxygen, carbon, or the like is added during the growing of ingot, the concentration of nitrogen, oxygen, or the like is determined in each ingot. Therefore, even when devices need to have different performances, it is not easy to manufacture a wide variety of devices in small quantities. Furthermore, if oxygen or the like is added during the growing of ingot, a concentration gradient of oxygen or the like exists in the direction of pulling up the ingot. Moreover, since the ingot is held in a quartz crucible, the concentration distribution of oxygen or the like varies between the center of the ingot and the periphery thereof, leading to a problem of poor reproducibility of a desired concentration.

In view of the foregoing problem, still another object of the present invention is to provide a method for manufacturing an SOI substrate, which can be used for manufacturing a wide variety of devices in small quantities.

One embodiment of the invention disclosed in this specification is a structure including a base substrate, an insulating layer over the base substrate, and a single crystal semiconductor layer over the insulating layer. A single crystal semiconductor substrate includes an embrittled region formed by the addition of hydrogen, and the single crystal semiconductor layer is obtained by separating the single crystal semiconductor substrate along the embrittled region. The concentration of nitrogen, oxygen, or carbon in the single crystal semiconductor layer is higher than that in a single crystal semiconductor ingot manufactured by the CZ method or in the single crystal semiconductor substrate.

The concentration of nitrogen in the region that contains the least amount of nitrogen in the depth direction of the single crystal semiconductor layer is $5\times10^{15}$ atoms/cm$^3$ or more, preferably $1\times10^{16}$ atoms/cm$^3$ or more, and more preferably $1\times10^{17}$ atoms/cm$^3$ or more when it is measured by SIMS (Secondary Ion Mass Spectroscopy).

The concentration of nitrogen in the single crystal semiconductor layer may be $5\times10^{15}$ atoms/cm$^3$ to $5\times10^{19}$ atoms/cm$^3$, preferably $1\times10^{16}$ atoms/cm$^3$ to $2\times10^{19}$ atoms/cm$^3$, and more preferably $1\times10^{17}$ atoms/cm$^3$ to $5\times10^{18}$ atoms/cm$^3$.

The single crystal semiconductor layer may include a region having a nitrogen concentration of $1\times10^{16}$ atoms/cm$^3$ or more, preferably $1\times10^{17}$ atoms/cm$^3$ or more, and more preferably $1\times10^{18}$ atoms/cm$^3$ or more.

The concentration of oxygen in the region that contains the least amount of oxygen in the depth direction of the single crystal semiconductor layer is $2\times10^{18}$ atoms/cm$^3$ or more, preferably $3\times10^{18}$ atoms/cm$^3$ or more, and more preferably $5\times10^{18}$ atoms/cm$^3$ or more when it is measured by SIMS.

The concentration of oxygen in the single crystal semiconductor layer may be $2\times10^{18}$ atoms/cm$^3$ to $1\times10^{20}$ atoms/cm$^3$, and preferably $3\times10^{18}$ atoms/cm$^3$ to $1\times10^{19}$ atoms/cm$^3$.

The single crystal semiconductor layer may include a region having an oxygen concentration of $2\times10^{18}$ atoms/cm$^3$ or more, and preferably $5\times10^{18}$ atoms/cm$^3$ or more. In the case where the concentration of oxygen is within the above ranges, the yield stress of the single crystal semiconductor layer can be increased to improve the mechanical strength.

The concentration of carbon in the region that contains the least amount of carbon in the depth direction of the single crystal semiconductor layer is $1\times10^{17}$ atoms/cm$^3$ or more, and preferably $5\times10^{17}$ atoms/cm$^3$ or more when it is measured by SIMS.

The concentration of carbon in the single crystal semiconductor layer may be $1\times10^{17}$ atoms/cm$^3$ to $5\times10^{20}$ atoms/cm$^3$, and preferably $5\times10^{17}$ atoms/cm$^3$ to $5\times10^{19}$ atoms/cm$^3$.

If a region where all the concentrations of nitrogen, oxygen, and carbon are low exists in the depth direction of a single crystal semiconductor layer with a reduced thickness, the yield stress of the region becomes extremely low to reduce the mechanical strength of the whole single crystal semiconductor layer. Thus, at least one of nitrogen, oxygen, and carbon is made to have a concentration equal to or more than the aforementioned minimum concentration to increase the yield stress of the single crystal semiconductor layer.

When the single crystal semiconductor layer includes a region having an oxygen concentration of $2\times10^{18}$ atoms/cm$^3$ or more, and preferably $5\times10^{18}$ atoms/cm$^3$ or more, the yield stress of the single crystal semiconductor layer can be increased.

When the single crystal semiconductor layer includes a region having a nitrogen concentration of $1\times10^{16}$ atoms/cm$^3$ or more, preferably $1\times10^{17}$ atoms/cm$^3$ or more, and more preferably $1\times10^{18}$ atoms/cm$^3$ or more, the yield stress of the single crystal semiconductor layer can be increased.

According to another embodiment of the invention disclosed in this specification, a single crystal semiconductor substrate is irradiated with accelerated ions to add hydrogen, so that an embrittled region is formed in a region at a predetermined depth from a surface of the single crystal semiconductor substrate; the single crystal semiconductor substrate is bonded to a base substrate with an insulating layer interposed therebetween; the single crystal semiconductor substrate is heated to be separated along the embrittled region, so that a single crystal semiconductor layer is provided over the base substrate with the insulating layer interposed therebetween; and a surface of the single crystal semiconductor layer is irradiated with a laser beam so that at least a superficial part of the single crystal semiconductor layer is melted, whereby the single crystal semiconductor layer is re-single-crystallized. When the laser beam is emitted, at least one element of nitrogen, oxygen, and carbon is added to the single crystal semiconductor layer. The concentration of nitrogen added to the single crystal semiconductor layer by laser light irradiation is $5\times10^{15}$ atoms/cm$^3$ to $5\times10^{19}$ atoms/cm$^3$. The concentration of oxygen added to the single crystal semiconductor layer is $2\times10^{18}$ atoms/cm$^3$ to $1\times10^{20}$ atoms/cm$^3$. The concentration of carbon added to the single crystal semiconductor layer is $1\times10^{17}$ atoms cm$^3$ to $5\times10^{20}$ atoms/cm$^3$.

In order that at least one of nitrogen, oxygen, and carbon is solid-dissolved in or added to the single crystal semiconductor layer, the single crystal semiconductor layer is preferably irradiated with a laser beam in an atmosphere containing at least one element of nitrogen, oxygen, and carbon. Alternatively, the single crystal semiconductor layer is preferably irradiated with a laser beam while being positively sprayed with a gas containing at least one element of nitrogen, oxygen, and carbon.

Further alternatively, an insulating layer containing at least one of nitrogen, oxygen, and carbon may be formed over the single crystal semiconductor layer and the insulating layer may be irradiated with a laser beam, so that nitrogen or the like contained in the insulating layer is diffused into the single crystal semiconductor layer when a surface of the single crystal semiconductor layer is melted. When the single crystal semiconductor layer is partly melted by laser light irradiation, nitrogen or the like can be solid-dissolved or added at a level equal to or more than the solid solubility of nitrogen or the like in a solid-phase single crystal semiconductor through a re-single-crystallizing step with a non-equilibrium state in which the solid-phase single crystal semiconductor is melted and cooled in a short time. Accordingly, nitrogen or the like can be added in a shorter time as compared to a manufacturing process of an ingot or the like requiring a long melting step. As a result, generation or growing of defects can be prevented.

The surface of the single crystal semiconductor layer may be melted by strong light irradiation with a lamp or the like or by irradiation with electromagnetic waves as well as laser light irradiation.

According to another embodiment of the invention disclosed in this specification, hydrogen is added to a single crystal semiconductor substrate so that an embrittled region is formed in a region at a predetermined depth from a surface of the single crystal semiconductor substrate, and at the same time, at least one element of nitrogen, oxygen and carbon is added to the single crystal semiconductor substrate. Then, the single crystal semiconductor substrate is bonded to a base substrate with an insulating layer interposed therebetween, and the single crystal semiconductor substrate is heated to be separated along the embrittled region, so that a single crystal semiconductor layer is provided over the base substrate with the insulating layer interposed therebetween. At the same time as the addition of hydrogen, at least one of nitrogen, oxygen, and carbon is added to the single crystal semiconductor substrate. Alternatively, hydrogen is added in an atmosphere containing at least one of nitrogen, oxygen, and carbon so that the embrittled region is formed in a region at a predetermined depth of the single crystal semiconductor substrate and at least the one element of nitrogen, oxygen, and carbon is added to a region from the surface of the single crystal semiconductor substrate to the embrittled region. As a result, the concentration of nitrogen or the like in the single crystal semiconductor layer that is separated later can be efficiently increased without increasing the concentration of nitrogen or the like in the single crystal semiconductor substrate before the separation.

In this specification, a "single crystal" refers to a crystal in which, when a certain crystal axis is focused, the direction of the crystal axis is oriented in the same direction in any portion of a sample and which has no crystal grain boundaries. Note that in this specification, the single crystal includes a crystal in which the direction of the crystal axis is uniform and which has no grain boundaries as described above even though it includes a crystal defect or a dangling bond. In addition, re-single-crystallization of a single crystal semiconductor layer means that a semiconductor layer having a single crystal structure returns to a single crystal structure after being in a different state from the single crystal structure (e.g., a liquid-phase state). Alternatively, it can be said that re-single-crystallization of a single crystal semiconductor layer means that a single crystal semiconductor layer is recrystallized to form a single crystal semiconductor layer.

In this specification, the concentrations of nitrogen, oxygen, and carbon in a single crystal semiconductor layer are represented by values obtained by SIMS. Note that data near the interface is also picked up by the SIMS in principle. Accordingly, the concentrations of nitrogen, oxygen, and carbon near the interface of the single crystal semiconductor layer are detected to be higher than practical concentrations of the single crystal semiconductor layer. For example, in the case where a single crystal semiconductor layer is in contact with a silicon oxide film, a silicon nitride oxide film, a silicon oxynitride film, or a silicon nitride film, the concentration of oxygen or nitrogen is higher near the interface between the single crystal semiconductor layer and such a film. Therefore, depending on the detection capability of SIMS, it is better not to consider the concentration near the top surface and the bottom surface of a single crystal semiconductor layer, namely, the concentration of a region of about 10 nm (preferably 20 nm, and more preferably 25 nm) from the interface.

Also in this specification, the minimum concentration or the lower limit of the concentration in a single crystal semiconductor layer refers to the concentration in a region having the lowest concentration when the single crystal semiconductor layer is measured by SIMS in the thickness direction.

Note that a semiconductor device in this specification indicates all the devices that can operate by using semiconductor characteristics, and an electro-optical device, a semiconductor circuit, and an electronic appliance are all included in the semiconductor devices.

Note that a display device in this specification includes a light-emitting device and a liquid crystal display device in its category. A light-emitting device has a light-emitting element, and a liquid crystal display device has a liquid crystal element. A Light-emitting element includes, in its category, an element whose luminance is controlled by current or voltage, and specifically includes an inorganic electroluminescent (EL) element, an organic EL element, and the like.

When at least one element of nitrogen, oxygen, and carbon is contained in a single crystal semiconductor layer formed on an insulating surface at a predetermined concentration, the mechanical strength of an SOI substrate having the single crystal semiconductor layer can be improved. Furthermore, generation of voids in the single crystal semiconductor layer can be suppressed.

BRIEF DESCRIPTION OF THE DRAWINGS

In the accompanying drawings:

FIGS. 1A to 1E are diagrams illustrating an example of a method for manufacturing an SOI substrate;

DETAILED DESCRIPTION OF THE INVENTION

Figures 1, 2A:
FIGS. 2A to 2D are diagrams illustrating an example of a method for manufacturing an SOI substrate.

Embodiments of the disclosed invention will be described with reference to drawings. Note that the present invention can be implemented in a wide variety of modes, and it is apparent to those skilled in the art that modes and details can be modified without departing from the spirit and scope of the present invention. Accordingly, the present invention should not be construed as being limited to the description of the embodiments given below. Note that in all the drawings for explaining the embodiments, like portions or portions having a similar function are denoted by like reference numerals, and the description thereof is omitted.

(Embodiment 1)

In this embodiment, an example of a method for manufacturing an SOI substrate will be described with reference to drawings. Specifically, description will be made on the steps of forming a single crystal semiconductor layer over a base substrate with an insulating layer interposed therebetween by Smart Cut (registered trademark) method and recovering the crystallinity of the single crystal semiconductor layer.

First, a single crystal semiconductor substrate 100 and a base substrate 120 are prepared (see FIGS. 1A and 1B).

As the single crystal semiconductor substrate 100, for example, a single crystal semiconductor substrate formed of an element belonging to Group 14, such as a single crystal silicon substrate, a single crystal germanium substrate, or a single crystal silicon germanium substrate, can be used. A commercially-available silicon substrate is typically a circular substrate having a size of 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 100 is not limited to a circular shape, and a single crystal semiconductor substrate processed into, for example, a rectangular shape can also be used. The single crystal semiconductor substrate 100 is preferably manufactured by a CZ method, even though it can also be manufactured by an FZ method.

As the base substrate 120, a substrate formed of an insulator can be used. Specifically, it is possible to use a variety of glass substrates used for the electronics industry, such as an aluminosilicate glass substrate, an aluminoborosilicate glass substrate, or a barium borosilicate glass substrate as well as a quartz substrate, a ceramic substrate, a sapphire substrate, or the like. Alternatively, a single crystal semiconductor substrate (for example, a single crystal silicon substrate) may be used as the base substrate 120. In this embodiment, a case of using a glass substrate is described. By using a glass substrate which can have a large area and is inexpensive as the base substrate 120, cost reduction can be achieved.

Next, an embrittled region 104 having a damaged crystal structure is formed at a predetermined depth from a surface of the single crystal semiconductor substrate 100. After that, the single crystal semiconductor substrate 100 and the base substrate 120 are bonded to each other with an insulating layer 102 interposed therebetween (see FIG. 1C).

The embrittled region 104 can be formed by irradiating the single crystal semiconductor substrate 100 with ions of hydrogen or the like.

The insulating layer 102 can be formed with a single layer or plural layers of a silicon oxide film, a silicon oxynitride film, a silicon nitride film, and/or a silicon nitride oxide film. These films can be formed by thermal oxidation, CVD, sputtering, or the like.

In this specification, a silicon oxynitride film refers to a film that contains more oxygen than nitrogen and, preferably, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. On the other hand, a silicon nitride oxide film refers to a film that contains more nitrogen than oxygen and, preferably, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Next, heat treatment is performed to separate the single crystal semiconductor substrate 100 along the embrittled region 104, whereby a single crystal semiconductor layer 124 (also simply referred to as a semiconductor layer) is provided over the base substrate 120 with the insulating layer 102 interposed therebetween (see FIG. 1D).

When the heat treatment is performed, the element added is precipitated into crystal defects formed in the embrittled region 104 by temperature increase, and the internal pressure of the crystal defects increases. The increase in pressure changes the volume of the crystal defects in the embrittled region 104 to generate cracks in the embrittled region 104, whereby the single crystal semiconductor substrate 100 is separated along the embrittled region 104. Since the insulating layer 102 is bonded to the base substrate 120, the single crystal semiconductor layer 124 that is separated from the single crystal semiconductor substrate 100 is provided over the base substrate 120.

Next, the surface of the single crystal semiconductor layer 124 provided over the base substrate 120 is irradiated with a laser beam 130, so that the crystallinity of the single crystal semiconductor layer 124 is recovered (re-single-crystallization) (see FIG. 1E). The irradiation with the laser beam 130 is performed in an atmosphere containing at least one of nitrogen, oxygen, and carbon. Alternatively, the irradiation with the laser beam 130 is performed while the single crystal semiconductor layer 124 is sprayed with a gas containing at least one of nitrogen, oxygen, and carbon.

In general, the crystallinity of a superficial part of the single crystal semiconductor layer 124 provided over the base substrate 120 after the separation is damaged because of crystal defects and the like formed due to the formation of the embrittled region 104, the separation along the embrittled region 104, and the like. Accordingly, the surface of the single crystal semiconductor layer 124 is irradiated with the laser beam 130 as illustrated in FIG. 1E, whereby at least the superficial part of the single crystal semiconductor layer 124 is melted to recover the crystallinity. Note that the crystallinity of the single crystal semiconductor layer 124 can be evaluated by observation with an optical microscope, Raman shift and full width at half maximum which are obtained from a Raman spectroscopy spectrum, or the like.

In this embodiment, it is preferable that the single crystal semiconductor layer 124 be melted not completely but partially (partial melting) by emitting the laser beam 130 from the side of the surface of the single crystal semiconductor layer 124 exposed by the separation. The partial melting means that a portion of the single crystal semiconductor layer 124, which is melted by the irradiation with the laser beam 130, has a depth smaller than the distance between the surface and the interface with the insulating layer 102 (the thickness of the single crystal semiconductor layer 124). That is, the upper part of the single crystal semiconductor layer 124 is melted to be brought into a liquid phase whereas the lower part thereof is kept in a solid phase without being melted.

By the partial melting of the single crystal semiconductor layer 124, crystals at the part melted by the irradiation with the laser beam 130 grow along a plane direction of the non-melted part of the single crystal semiconductor layer; therefore, recrystallization can be performed with the plane direction aligned as compared with the case of complete melting. At this time, since the partial melting is performed in an atmosphere containing nitrogen, oxygen, or carbon, the element in the atmosphere is contained in the single crystal semiconductor layer 124. While the superficial part of the single crystal semiconductor layer 124 is melted, the solid solubility of nitrogen or the like increases so that nitrogen or the like in the atmosphere is diffused into the single crystal semiconductor layer 124 which is being melted. Thus, the concentration of nitrogen or the like in the single crystal semiconductor layer 124 solidified can be made higher.

In this embodiment, the irradiation with the laser beam 130 is performed in a chamber having a nitrogen atmosphere. When the single crystal semiconductor layer 124 is irradiated with the laser beam 130 in such an atmosphere to be melted, nitrogen in the atmosphere is easily contained in the single crystal semiconductor layer 124. The contained nitrogen atoms are trapped in the dislocation in the single crystal semiconductor layer 124, and the dislocation is fixed. As a result, the yield stress increases to improve the mechanical strength of the single crystal semiconductor layer.

Furthermore, the addition of nitrogen can reduce the size or the amount of change in the size of voids generated in the single crystal semiconductor layer 124. Note that nitrogen has a stronger effect of fixing than oxygen; thus, it is preferable to add nitrogen to fix the dislocation.

On the other hand, it is effective to add oxygen in consideration of the diffusion rate and solid solubility. Therefore, the laser beam 130 may be emitted in an oxygen atmosphere or an atmosphere containing oxygen and nitrogen instead of a nitrogen atmosphere. The addition of oxygen in the single crystal semiconductor layer 124 also produces an effect that the interstitial oxygen concentration of the single crystal semiconductor layer 124 increases and the single crystal semiconductor layer 124 does not warp easily.

In this embodiment, carbon may be added instead of nitrogen; however, it is particularly preferable that carbon be added in addition to nitrogen. This is because carbon has an effect of reducing crystal defects due to the addition of nitrogen, and the addition of carbon makes it possible to easily control defects. Any of such a nitrogen gas, an oxygen gas, and a gas containing carbon as one of its components may be selected as appropriate to be introduced into a chamber in which the laser irradiation process is performed.

When a nitrogen gas or an oxygen gas is introduced using a gas refining apparatus (purification apparatus), the purity of a supplied gas can be improved and the concentration of nitrogen or oxygen in the atmosphere can be controlled to be effectively increased. Alternatively, the irradiation with the laser beam 130 may be performed in a reduced-pressure atmosphere.

Specifically, the minimum concentration of nitrogen in the single crystal semiconductor layer 124 including the portion melted by the irradiation with the laser beam 130 may be $5 \times 10^{15}$ atoms/cm$^3$ or more, preferably $1 \times 10^{16}$ atoms/cm$^3$ or more, and more preferably $1 \times 10^{17}$ atoms/cm$^3$ or more. Alternatively, the single crystal semiconductor layer 124 may include a region having a nitrogen concentration of $1 \times 10^{16}$ atoms/cm$^3$ or more, preferably $1 \times 10^{17}$ atoms/cm$^3$ or more, and more preferably $1 \times 10^{18}$ atoms/cm$^3$ or more. In consideration of the characteristics of a transistor using the single crystal semiconductor layer, the upper limit of the concentration of nitrogen is preferably determined: $5 \times 10^{19}$ atoms/cm$^3$ or less, preferably $2 \times 10^{19}$ atoms/cm$^3$ or less, and more preferably $5 \times 10^{18}$ atoms/cm$^3$ or less. Note that the nitrogen concentration in the single crystal semiconductor layer 124 can be measured by SIMS.

Alternatively, the laser beam 130 may be emitted while the single crystal semiconductor layer 124 is positively sprayed with a nitrogen gas (N$_2$ gas) instead of being in a nitrogen atmosphere. Further alternatively, the laser beam 130 may be emitted while the single crystal semiconductor layer 124 is sprayed with a nitrogen gas in a nitrogen atmosphere. As a result, nitrogen elements are contained (solid-dissolved) in the single crystal semiconductor layer 124 more easily. It is needless to say that the single crystal semiconductor layer 124 may be sprayed with an oxygen gas (O$_2$ gas) or a gas containing carbon as one of its components (e.g., CO$_2$ gas) instead of a nitrogen gas. Furthermore, the laser beam 130 may be emitted while the single crystal semiconductor layer 124 is sprayed with a gas containing at least two or more elements of nitrogen, oxygen, and carbon. The minimum concentration of oxygen in the single crystal semiconductor layer 124 may be $2 \times 10^{18}$ atoms/cm$^3$ or more, preferably $3 \times 10^{18}$ atoms/cm$^3$ or more, and more preferably $5 \times 10^{18}$ atoms/cm$^3$ or more. In consideration of the characteristics of a transistor using the single crystal semiconductor layer, the upper limit of the concentration of oxygen is preferably $1 \times 10^{20}$ atoms/cm$^3$ or less, and more preferably $1 \times 10^{19}$ atoms/cm$^3$ or less. Alternatively, the single crystal semiconductor layer 124 may include a region having an oxygen concentration of $2 \times 10^{18}$ atoms/cm$^3$ or more, and preferably $5 \times 10^{18}$ atoms/cm$^3$ or more to improve the mechanical strength. The minimum concentration of carbon in the single crystal semiconductor layer 124 may be $1 \times 10^{17}$ atoms/cm$^3$ or more, and preferably $5 \times 10^{17}$ atoms/cm$^3$ or more. In consideration of the characteristics of a transistor using the single crystal semiconductor layer, the upper limit of the concentration of carbon is preferably $5 \times 10^{20}$ atoms/cm$^3$ or less, and more preferably $5 \times 10^{19}$ atoms/cm$^3$ or less.

As a laser which can be used in this embodiment, a laser having an oscillation wavelength in the range of the ultraviolet to visible light region is selected. The laser beam 130 has a wavelength which is absorbed by the single crystal semiconductor layer 124, and the wavelength can be determined in consideration of the skin depth of the laser beam, and the like. For example, the wavelength can be set in the range of 250 nm to 700 nm.

As the laser, a pulsed laser or a continuous wave laser (CW laser) can be used. For example, a pulsed laser preferably has a repetition rate of less than 10 MHz and a pulse width of 10 nanoseconds to 500 nanoseconds. A typical pulsed laser is an excimer laser that emits a laser beam having a wavelength of 400 nm or less. As the aforementioned excimer laser, for example, it is possible to use a XeCl excimer laser having a repetition rate of 10 Hz to 300 Hz, a pulse width of 25 nanoseconds, and a wavelength of 308 nm. In addition, in scanning with the pulsed laser beam, one shot and the following shot may be partially overlapped with each other. By partially overlapping one shot with the following shot in laser irradiation, partial refining of single crystals is performed repeatedly, whereby a single crystal semiconductor layer having excellent characteristics can be obtained.

Further, the range of the energy density of the laser beam to partially melt the single crystal semiconductor layer 124 is set to such an energy density that the single crystal semiconductor layer 124 is not completely melted, in consideration of the wavelength of the laser beam, the skin depth thereof, the thickness of the single crystal semiconductor layer 124, and the like. For example, when the thickness of the single crystal semiconductor layer 124 is large, the energy necessary for completely melting the single crystal semiconductor layer 124 is also large, and thus the range of the energy density of the laser beam can be set to be wide. On the other hand, when the thickness of the single crystal semiconductor layer 124 is small, the energy necessary for completely melting the single crystal semiconductor layer 124 is also small, and thus the energy density of the laser beam is preferably set to be small. Note that when the single crystal semiconductor layer 124 is irradiated with the laser beam while being heated, the upper limit of the range of the energy density necessary for partially melting is preferably set to be small to prevent completely melting of the single crystal semiconductor layer 124.

By employing the method described in this embodiment, even when the single crystal semiconductor layer provided over the base substrate is melted by irradiation with the laser beam to recover the crystallinity, at least one of nitrogen, oxygen, and carbon is contained in the single crystal semiconductor layer in the laser irradiation process; thus, generation of voids in the single crystal semiconductor layer can be prevented.

In addition, these atoms are trapped in the dislocation in the single crystal semiconductor layer to fix the dislocation, whereby the mechanical strength of the single crystal semiconductor layer can be improved.

A large amount of nitrogen or the like can be intentionally contained in a single crystal semiconductor ingot during the manufacturing process. In that case, however, such an element is precipitated to produce a huge defect because of a long melting step and a long cooling step with pulling up the ingot. Moreover, a concentration gradient of oxygen exists in the direction of pulling up the ingot. Furthermore, since the ingot is held in a quartz crucible, the concentration distribution of oxygen or the like varies between the center of the ingot and the periphery thereof.

According to one embodiment of the invention disclosed in this embodiment, nitrogen or the like is solid-dissolved during partial melting by laser irradiation, which reduces the melting time and cooling time and prevents generation and growing of defects.

Furthermore, the concentration of nitrogen or the like can be controlled for each single crystal semiconductor layer after the manufacturing of the ingot; therefore, a wide variety of SOI substrates each satisfying a given specification can be manufactured in small quantities.

In addition, the SOI substrate manufactured in this embodiment has an improved mechanical strength, and thus is suitable to be used for a flexible device.

Although the surface of the single crystal semiconductor layer 124 is directly irradiated with the laser beam 130 in this embodiment, a film containing at least one of nitrogen, oxygen, and carbon may be formed on the single crystal semiconductor layer 124, and a surface of the film may be irradiated with the laser beam 130. As the film, for example, a silicon nitride film, a silicon oxide film, a silicon carbide film, a silicon nitride oxide film, or a silicon oxynitride film may be used. When the film is irradiated with the laser beam 130, the element such as nitrogen or oxygen in the film is contained in the single crystal semiconductor layer 124. As a result, the concentration of nitrogen, oxygen, or carbon which is solid-dissolved in the single crystal semiconductor layer 124 can be further increased.

When the concentration of oxygen, nitrogen, or carbon in the single crystal semiconductor layer 124 is higher than that in a single crystal semiconductor ingot manufactured by the CZ method, a device including a transistor and the like using the single crystal semiconductor layer 124 can have an improved mechanical strength. Accordingly, when the single crystal semiconductor layer provided over the base substrate, which is described in this embodiment, is used as an active layer and the like of a transistor in a display and the like, the display is not easily damaged even when, for example, bending stress is applied to the display. Furthermore, in this embodiment, an element such as nitrogen or oxygen may be added at the same time as adding hydrogen to form an embrittled region. Thus, the mechanical strength of a device obtained can be improved without requiring additional steps. In addition, an element such as nitrogen or oxygen is added during a laser irradiation process, resulting in an improvement in the mechanical strength of a device without requiring additional steps. Moreover, since the single crystal semiconductor layer is partially melted by being irradiated with a laser beam, an element such as nitrogen or oxygen is easily solid-dissolved and the concentration of such an element can be increased to a desired level.

Note that the structure shown in this embodiment can be combined with structures shown in other embodiments in this specification as appropriate.

(Embodiment 2)

In this embodiment, bonding of the single crystal semiconductor substrate 100 to the base substrate 120 will be described in detail with reference to drawings.

First, the single crystal semiconductor substrate 100 is prepared (see FIG. 2A-1). It is preferable that the surface of the single crystal semiconductor substrate 100 be cleaned in advance with a sulfuric acid/hydrogen peroxide mixture (SPM), an ammonium hydroxide/hydrogen peroxide mixture (APM), a hydrochloric acid/hydrogen peroxide mixture (HPM), hydrofluoric acid/hydrogen peroxide mixture (FPM), dilute hydrofluoric acid (DHF), or the like to remove dust. Dilute hydrofluoric acid and ozone water may be discharged alternately for cleaning. In the case where a natural oxide film is formed on the surface of the single crystal semiconductor substrate 100, the natural oxide film can be removed by alternately discharging ozone water and dilute hydrofluoric acid on the surface of the single crystal semiconductor substrate 100 while rotating the single crystal semiconductor substrate 100 in the horizontal direction. After the natural oxide film is removed, a chemical oxide may be formed on the single crystal semiconductor substrate 100, which can suppress the generation of watermarks during cleaning and drying. The chemical oxide is not necessarily formed if no watermark is generated.

Figures 1, 2B:
Figures 2, 2A:
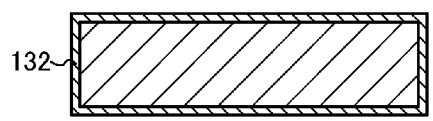
Figures 2, 2B:
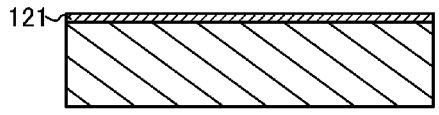

Next, an oxide film 132 is formed on the surface of the single crystal semiconductor substrate 100 (see FIG. 2A-2).

The oxide film 132 can be formed with a single layer or plural layers of a silicon oxide film, a silicon oxynitride film and/or the like. These films can be formed by thermal oxidation, CVD, sputtering, or the like. In the case where the oxide film 132 is formed by CVD, a silicon oxide film formed using organosilane such as tetraethoxysilane (abbreviation: TEOS, chemical formula: $Si(OC_2H_5)_4$) is preferably used as the oxide film 132 in terms of productivity.

In this embodiment, the single crystal semiconductor substrate 100 is subjected to thermal oxidation treatment to form the oxide film 132 (here, $SiO_x$ film) (see FIG. 2A-2). The thermal oxidation treatment is preferably performed in an oxidizing atmosphere to which halogen is added.

For example, the single crystal semiconductor substrate 100 is subjected to thermal oxidation treatment in an oxidizing atmosphere to which hydrogen chloride is added, so that the oxide film 132 is formed. In that case, the oxide film 132 contains a chlorine atom.

The chlorine atom contained in the oxide film 132 forms distortion. As a result, the moisture absorption rate of the oxide film 132 increases and the diffusion rate increases. That is, in the case where moisture is present on the surface of the oxide film 132, the moisture can be rapidly absorbed and diffused in the oxide film 132. In addition, defects due to oxide precipitated in a single crystal semiconductor film can be eliminated. Furthermore, a chloride of a heavy metal (such as Fe, Cr, Ni, or Mo) which is an extrinsic impurity can be formed to perform chemical gettering with outward diffusion so that the heavy metal is removed from the single crystal semiconductor substrate 100.

For example, the thermal oxidation treatment can be performed at a temperature of 750° C. to 1150° C., and preferably 900° C. to 1100° C. (typically, 1000° C.) in an oxidizing atmosphere containing hydrogen chloride (HCl) at 0.5 vol % to 10 vol % (preferably 2 vol %) with respect to oxygen. Treatment time may be 0.1 to 6 hours, preferably 0.5 to 1 hour. The thickness of the oxide film that is formed can be 10 nm to 1000 nm (preferably 50 nm to 200 nm), for example, 100 nm. The formation of the oxide film 132 in an oxidizing atmosphere containing hydrogen chloride can increase the withstand voltage and reduce the interface state density between the single crystal semiconductor substrate 100 and the oxide film 132.

In this embodiment, the concentration of chlorine in the oxide film 132 is controlled to $1\times10^{17}$ atoms/cm$^3$ to $1\times10^{21}$ atoms/cm$^3$.

When halogen such as chlorine is contained in the oxide film 132 by HCl oxidation or the like, an impurity which adversely affects the single crystal semiconductor substrate (for example, a mobile ion such as Na) can be gettered. That is, through the heat treatment performed after the formation of the oxide film 132, the impurity contained in the single crystal semiconductor substrate is precipitated in the oxide film 132, and reacts with halogen (such as chlorine) to be captured or neutralized. Thus, the impurity captured in the oxide film 132 can be fixed to prevent contamination of the single crystal semiconductor substrate 100. Furthermore, when the oxide film 132 is bonded to a glass substrate, the oxide film 132 can serve as a film which fixes an impurity such as Na contained in the glass.

In particular, halogen such as chlorine contained in the oxide film 132 by HCl oxidation or the like is effective to remove contamination of a semiconductor substrate which is not cleaned sufficiently or a semiconductor substrate which is reused repeatedly.

The halogen atom to be contained in the oxide film 132 is not limited to a chlorine atom. A fluorine atom may be contained in the oxide film 132. In order that the surface of the single crystal semiconductor substrate 100 is fluoro-oxidized, the surface of the single crystal semiconductor substrate 100 may be soaked in HF solution and then subjected to thermal oxidation in an oxidizing atmosphere, or thermal oxidation may be performed on the single crystal semiconductor substrate 100 in an oxidizing atmosphere to which NF$_3$ is added.

Furthermore, after the thermal oxidation treatment is performed in an oxidizing atmosphere containing hydrogen chloride, heat treatment is preferably performed in a nitrogen atmosphere. As a result, defects can be reduced.

Figures 2, 2A, 3:
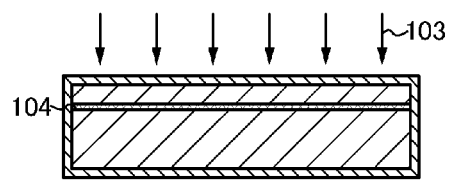
FIG. 3 is a diagram illustrating an example of a laser irradiation apparatus used in a method for manufacturing an SOI substrate.

Then, the single crystal semiconductor substrate 100 is irradiated with ions having kinetic energy, whereby the embrittled region 104 whose crystal structure is damaged is formed at a predetermined depth of the single crystal semiconductor substrate 100 (see FIG. 2A-3). When the single crystal semiconductor substrate 100 is irradiated with ions 103 which are accelerated through the oxide film 132 as illustrated in FIG. 2A-3, the ions 103 are added to a region at a predetermined depth from the surface of the single crystal semiconductor substrate 100 and the embrittled region 104 can be formed. The ions 103 are obtained as follows: a source gas is excited to generate plasma of the source gas, and ions included in this plasma are extracted from the plasma by the action of an electric field and then accelerated.

The depth at which the embrittled region 104 is formed can be controlled by the kinetic energy, mass, charge, and incident angle of the ions 103. The kinetic energy can be controlled by an acceleration voltage, dosage, or the like. The embrittled region 104 is formed at a depth substantially equal to the average penetration depth of the ions 103. Therefore, the thickness of a single crystal semiconductor layer separated from the single crystal semiconductor substrate 100 is determined by the implantation depth of the ions 103. The depth at which the embrittled region 104 is formed is controlled so that the thickness of the single crystal semiconductor layer is 50 nm to 500 nm, and preferably 100 nm to 200 nm.

The embrittled region 104 can be formed by ion doping treatment. The ion doping treatment can be performed using an ion doping apparatus. An ion doping apparatus is typically a non-mass-separation apparatus for irradiating a processing object disposed in a chamber with all kinds of ion species which are generated by plasma excitation of a process gas. The apparatus is called "non-mass-separation apparatus" because a processing object is irradiated with all kinds of ion species without mass separation of ion species in plasma. In contrast, an ion-implantation apparatus is a mass-separation apparatus. The ion-implantation apparatus is an apparatus with which a processing object is irradiated with ion species having a specific mass through mass separation of ion species in plasma.

Main components of the ion doping apparatus are as follows: a chamber in which a processing object is disposed, an ion source for generating desired ions, and an acceleration mechanism for accelerating and emitting ions. The ion source includes a gas supply device for supplying a source gas to generate a desired ion species, an electrode for exciting the source gas to generate plasma, and the like. As the electrode for generating plasma, a filament electrode, a capacitive coupling high-frequency discharging electrode, or the like is used. The acceleration mechanism includes electrodes such as an extraction electrode, an acceleration electrode, a deceleration electrode, and a ground electrode; a power supply for supplying power to these electrodes; and the like. These electrodes that are included in the acceleration mechanism are provided with a plurality of openings or slits, through which the ions that are generated from the ion source are accelerated. Note that the components of the ion doping apparatus are not limited to the above-mentioned components, and another mechanism is provided as needed.

In this embodiment, hydrogen is added to the single crystal semiconductor substrate 100 with an ion doping apparatus. A gas containing hydrogen, for example, H$_2$, is supplied as a plasma source gas. A hydrogen gas is introduced into a vacuum, and RF power is introduced by a capacitive coupling method or an inductive coupling method, so that hydrogen molecules are excited to generate plasma. Then, ions included in plasma are accelerated without mass separation, and the single crystal semiconductor substrate 100 is irradiated with the accelerated ions. Plasma may be generated in such a manner that a direct current flows through a high dielectric constant metal such as tungsten to emit thermal electrons, and the thermal electrons collide with the hydrogen gas. A vacuum atmosphere is kept by evacuation with a turbo-molecular pump while introducing a hydrogen gas. The vacuum atmosphere may have a pressure of $1\times10^{-3}$ Pa to $1\times10^{-1}$ Pa by introducing a hydrogen gas into an atmosphere having a back-pressure of $1\times10^{-6}$ Pa to $1\times10^{-4}$ Pa.

In an ion doping apparatus, the percentage of H$_3^+$ to the total amount of ion species (H$^+$, H$_2^+$, and H$_3^+$) that are generated from a hydrogen gas is set to 50% or more. More preferably, the percentage of H$_3^+$ is set to 80% or more. Since mass separation is not performed in the ion doping apparatus, the percentage of one kind (H$_3^+$) to plural kinds of ion species generated in plasma is preferably set to 50% or more, and more preferably 80% or more. By irradiation with ions having the same mass, ions can be added in a concentrated manner to the same depth in the single crystal semiconductor substrate 100.

In order to form the embrittled region 104 in a shallow region, the acceleration voltage for the ions 103 needs to be low. With an increase in the percentage of H$_3^+$ ions in plasma, atomic hydrogen (H) can be efficiently added to the single crystal semiconductor substrate 100. Since the mass of H$_3^+$ ions is three times as large as that of H$^+$ ions, when one hydrogen atom is added to the same depth, the acceleration voltage of H$_3^+$ ions can be three times as high as that of H$^+$ ions. When the acceleration voltage of ions can be increased, the takt time of an ion irradiation step can be shortened, resulting in an improvement in productivity and throughput.

Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in productivity can be obtained.

Note that the step of irradiating the single crystal semiconductor substrate 100 with the ions 103 which are accelerated can also be performed by an ion implantation apparatus. An ion implantation apparatus is a mass-separation apparatus with which a processing object which is disposed in a chamber is irradiated with an ion species having a specific mass after mass separation of plural kinds of ion species generated by excitation of a source gas into plasma. Thus, when an ion implantation apparatus is used, $H^+$ ions and $H_2^+$ ions that are generated by excitation of a hydrogen gas or $PH_3$ are subjected to mass separation, and either $H^+$ ions or $H_2^+$ ions are accelerated, with which the single crystal semiconductor substrate 100 is irradiated.

In this embodiment, nitrogen and oxygen as well as hydrogen are added to the single crystal semiconductor substrate 100. Carbon may also be added in addition to nitrogen and oxygen. Alternatively, one or a combination of nitrogen, oxygen, and carbon may be added. In the case of using an ion doping apparatus, the single crystal semiconductor substrate 100 is mainly doped with $H_3^+$ ions, and also doped with $O_2^+$ ions or $N_2^+$ ions at the same time. $O_2^+$ ions and $N_2^+$ ions have a larger mass than $H_3^+$ ions, and thus $H_3^+$ ions are added at a deeper depth in the single crystal semiconductor substrate 100. Accordingly, the embrittled region 104 is formed at a depth substantially equal to the average penetration depth of $H_3^+$ ions, and a region shallower than the embrittled region 104, namely, a region which is separated later to be the single crystal semiconductor layer 124 is doped with a large amount of $O_2^+$ ions or $N_2^+$ ions. As a result, the mechanical strength of the single crystal semiconductor layer can be improved. With the ion implantation apparatus and the ion doping apparatus, an element directly added to a substrate can be selected, and thus the concentration of nitrogen or the like in the substrate can be controlled more easily than with a laser irradiation apparatus.

The concentration of nitrogen in the region between the surface of the single crystal semiconductor substrate 100 and the embrittled region 104 may be $5 \times 10^{15}$ atoms/cm$^3$ or more, preferably $1 \times 10^{16}$ atoms/cm$^3$ or more, and more preferably $1 \times 10^{17}$ atoms/cm$^3$ or more. The concentration of oxygen may be $2 \times 10^{18}$ atoms/cm$^3$ or more, preferably $3 \times 10^{18}$ atoms/cm$^3$ or more, and more preferably $5 \times 10^{18}$ atoms/cm$^3$ or more. In order to control the concentration of oxygen, it is also effective to provide a region having an oxygen concentration of $2 \times 10^{18}$ atoms/cm$^3$ or more, and preferably $5 \times 10^{18}$ atoms/cm$^3$ or more. In the case where carbon is added in addition to nitrogen and oxygen, or only carbon is added, the concentration of carbon may be $1 \times 10^{17}$ atoms/cm$^3$ or more, and preferably $5 \times 10^{17}$ atoms/cm$^3$ or more. Note that each of the concentrations is represented by a value obtained by SIMS. When one of nitrogen, oxygen, and carbon is contained in the region between the surface of the single crystal semiconductor substrate 100 and the embrittled region 104 so as to be within the above range, the mechanical strength of the single crystal semiconductor layer 100 can be improved and growing of dislocation can be suppressed. In particular, it is preferable to add carbon in addition to nitrogen because carbon has an effect of reducing crystal defects due to the addition of nitrogen. Furthermore, if the oxide film 132 is formed by oxidation, oxygen in the single crystal semiconductor substrate 100 is extracted by high-heat treatment, leading to a decrease in the concentration of oxygen in the substrate. Accordingly, oxygen is preferably added in addition to hydrogen in order to increase the concentration of oxygen in the single crystal semiconductor substrate 100, which has been decreased.

It is also possible to use nitrogen or oxygen contained in the back-pressure when plasma of a hydrogen gas is generated by introducing a hydrogen gas into a vacuum atmosphere. In the case of adding nitrogen, oxygen, or carbon in addition to hydrogen, an ion doping apparatus is preferably used. This is because, since mass separation is not performed in the ion doping apparatus, plural kinds of ions selected from nitrogen, oxygen, and carbon can be simultaneously added and the percentage of ions including atoms other than hydrogen can be controlled by the ratio between the back-pressure and the processing pressure, the plasma generating method, and the like.

Next, the base substrate 120 is prepared (see FIG. 2B-1).

As the base substrate 120, a substrate formed of an insulator is used. Specifically, it is possible to use a variety of glass substrates used for the electronics industry, such as an aluminosilicate glass substrate, an aluminoborosilicate glass substrate, a barium borosilicate glass substrate, a lanthana aluminosilicate glass substrate, or a titania lanthana aluminosilicate glass substrate as well as a quartz substrate, a ceramic substrate, a sapphire substrate, or the like. In this embodiment, a case of using a glass substrate is described. By using a glass substrate which can have a large area and is inexpensive as the base substrate 120, cost reduction can be achieved.

It is preferable that the surface of the base substrate 120 be cleaned before being used. Specifically, the base substrate 120 is subjected to ultrasonic cleaning using hydrochloric acid/hydrogen peroxide mixture (HPM), sulfuric acid/hydrogen peroxide mixture (SPM), ammonium hydroxide/hydrogen peroxide mixture (APM), dilute hydrofluoric acid (DHF), or the like. For example, the surface of the base substrate 120 is preferably subjected to ultrasonic cleaning using hydrochloric acid/hydrogen peroxide mixture. Through such cleaning treatment, the surface of the base substrate 120 can be planarized and abrasive particles remaining on the surface of the base substrate 120 can be removed.

Next, a nitrogen-containing layer 121 (for example, an insulating film containing nitrogen, such as a silicon nitride film ($SiN_x$) or a silicon nitride oxide film ($SiN_xO_y$)(x>y)) is formed on the surface of the base substrate 120 (see FIG. 2B-2).

In this embodiment, the nitrogen-containing layer 121 serves as a layer (a bonding layer) bonded to the oxide film 132 provided on the single crystal semiconductor substrate 100. In addition, when a single crystal semiconductor layer having a single crystal structure is provided over the base substrate later, the nitrogen-containing layer 121 also serves as a barrier layer for preventing impurities such as sodium (Na) contained in the base substrate from diffusing into the single crystal semiconductor layer.

Since the nitrogen-containing layer 121 is used as the bonding layer, it is preferable that the nitrogen-containing layer 121 have a smooth surface in order to suppress defective bonding. Specifically, the nitrogen-containing layer 121 is formed to have a surface with an average surface roughness (Ra) of 0.5 nm or less and a root-mean-square surface roughness (Rms) of 0.60 nm or less, preferably, an average surface roughness of 0.20 nm or less and a root-mean-square surface roughness of 0.25 nm or less. The thickness of the nitrogen-containing layer 121 is preferably in the range of 10 nm to 200 nm, and more preferably 50 nm to 100 nm.

Figure 2C:
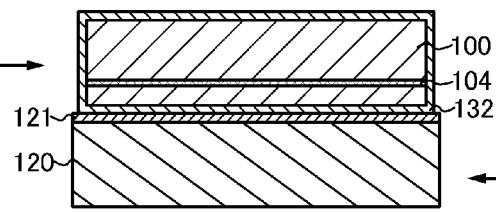

Next, the surface of the single crystal semiconductor substrate 100 and the surface of the base substrate 120 are disposed to face each other and then the surface of the oxide film 132 and the surface of the nitrogen-containing layer 121 are bonded together (see FIG. 2C).

Here, after the single crystal semiconductor substrate 100 and the base substrate 120 are bonded together with the oxide film 132 and the nitrogen-containing layer 121 interposed therebetween, a pressure of approximately 1 N/cm² to 500 N/cm², and preferably 1 N/cm² to 20 N/cm² is applied to a part of the single crystal semiconductor substrate 100. Bonding of the oxide film 132 and the nitrogen-containing layer 121 begins at the part to which the pressure is applied and then extends spontaneously throughout the surface. This bonding step, which is performed by the action of van der Waals force or hydrogen bonding, can be performed at room temperature without any heat treatment. Thus, a substrate having a low temperature limit, such as a glass substrate, can be used as the base substrate 120. In the bonding step, particularly when the bonding surfaces are hydrophilic and hydrophilic groups such as OH groups or water molecules (H₂O) are present on the bonding surfaces, hydrogen bonds are easily formed to promote the bonding. Such a phenomenon proceeds rapidly if the bonding surfaces are smooth, because the distance between the bonding surfaces is easily reduced.

Accordingly, before the single crystal semiconductor substrate 100 is bonded to the base substrate 120, surface treatment is preferably performed on the oxide film 132 formed over the single crystal semiconductor substrate 100 and the nitrogen-containing layer 121 formed over the base substrate 120.

As the surface treatment, plasma treatment, ozone treatment, megasonic cleaning, two-fluid cleaning (a method for spraying functional water such as pure water or hydrogen-containing water with a carrier gas such as nitrogen), or a combination thereof can be performed. Specifically, ozone treatment, megasonic cleaning, two-fluid cleaning, or the like is performed after the surface of at least one of the oxide film 132 and the nitrogen-containing layer 121 is subjected to plasma treatment, whereby dust such as an organic substance on the surface of the oxide film 132 and the nitrogen-containing layer 121 can be removed and the surfaces can be made hydrophilic. As a result, the bonding strength between the oxide film 132 and the nitrogen-containing layer 121 can be increased.

Here, an example of ozone treatment is described. For example, ozone treatment can be performed on a surface of a processing object by irradiation with ultraviolet (UV) light in an atmosphere containing oxygen. The ozone treatment in which irradiation with ultraviolet light is performed in an atmosphere containing oxygen is also referred to as UV ozone treatment, ultraviolet ozone treatment, or the like. By irradiation with ultraviolet light having a wavelength of lower than 200 nm and ultraviolet light having a wavelength of 200 nm or higher in an atmosphere containing oxygen, ozone can be generated and singlet oxygen can be generated from the ozone. By irradiation with ultraviolet light having a wavelength of lower than 180 nm, ozone can be generated and singlet oxygen can also be generated from the ozone.

An example of a reaction caused by irradiation with ultraviolet light having a wavelength of lower than 200 nm and ultraviolet light having a wavelength of 200 nm or higher in an atmosphere containing oxygen is shown below.

$$O_2 + h\nu(\lambda_1 \text{ nm}) \rightarrow O(^3P) + O(^3P) \tag{1}$$

$$O(^3P) + O_2 \rightarrow O_3 \tag{2}$$

$$O_3 + h\nu(\lambda_2 \text{ nm}) \rightarrow O(^1D) + O_2 \tag{3}$$

In the reaction formula (1), by irradiation with ultraviolet light (hν) having a wavelength of lower than 200 nm ($\lambda_1$ nm) in an atmosphere containing oxygen (O₂), oxygen atoms in a ground state (O(³P)) are generated. Then, in the reaction formula (2), the oxygen atom in a ground state (O(³P)) and oxygen (O₂) react with each other to generate ozone (O₃). Next, in the reaction formula (3), irradiation with ultraviolet light having a wavelength of 200 nm or higher ($\lambda_2$ nm) is performed in an atmosphere containing the generated ozone (O₃), whereby singlet oxygen in an excited state O(¹D) is generated. In an atmosphere containing oxygen, ozone is generated by irradiation with ultraviolet light having a wavelength of lower than 200 nm, and the ozone is decomposed to generate singlet oxygen by irradiation with ultraviolet light having a wavelength of 200 nm or higher. The above-described ozone treatment can be performed by, for example, irradiation with a low-pressure mercury lamp ($\lambda_1$=185 nm, $\lambda_2$=254 nm) in an atmosphere containing oxygen.

Further, an example of a reaction caused by irradiation with ultraviolet light having a wavelength of lower than 180 nm in an atmosphere containing oxygen is shown below.

$$O_2 + h\nu(\lambda_3 \text{ nm}) \rightarrow O(^1D) + O(^3P) \tag{4}$$

$$O(^3P) + O_2 \rightarrow O_3 \tag{5}$$

$$O_3 + h\nu(\lambda_3 \text{ nm}) \rightarrow O(^1D) + O_2 \tag{6}$$

In the reaction formula (4), by irradiation with ultraviolet light having a wavelength of lower than 180 nm ($\lambda_3$ nm) in an atmosphere containing oxygen (O₂), singlet oxygen in an excited state O(¹D) and an oxygen atom in a ground state (O(³P)) are generated. Then, in the reaction formula (5), the oxygen atom in a ground state (O(³P)) and oxygen (O₂) react with each other to generate ozone (O₃). In the reaction formula (6), irradiation with ultraviolet light having a wavelength of lower than 180 nm ($\lambda_3$ nm) is performed in an atmosphere containing the generated ozone (O₃), whereby singlet oxygen in an excited state and oxygen are generated. By irradiation with ultraviolet light having a wavelength of lower than 180 nm in an atmosphere containing oxygen, ozone is generated and the ozone or oxygen is decomposed to generate singlet oxygen. The above-described ozone treatment can be performed by, for example, irradiation with a Xe excimer UV lamp ($\lambda_3$=172 nm) in an atmosphere containing oxygen.

Chemical bonds of organic substances or the like which are attached to the surface of a processing object are cut by ultraviolet light having a wavelength of lower than 200 nm Then, organic substances attached to the surface of the processing object, organic substances whose chemical bonds are cut, or the like can be oxidatively decomposed by ozone or singlet oxygen generated from ozone to be removed. The above-described ozone treatment can increase the hydrophilic properties and cleanliness of the surface of the processing object; accordingly, bonding can be favorably performed.

By irradiation with ultraviolet light in an atmosphere containing oxygen, ozone is generated. Ozone has an effect of removing organic substances attached to a surface of a processing object. In addition, singlet oxygen has an effect of removing organic substances attached to a surface of a processing object at a level equal to or more than the ozone. Ozone and singlet oxygen are examples of oxygen in an active state and also collectively referred to as active oxygen. As described in the above reaction formulae and the like, there are a reaction in which ozone is generated in generation of singlet oxygen and a reaction in which singlet oxygen is generated from ozone. Therefore, reactions to which singlet oxygen contributes are also referred to as ozone treatment in convenience.

After the oxide film 132 and the nitrogen-containing layer 121 are bonded to each other, heat treatment is preferably performed in order to increase the bonding strength. This heat treatment is performed at a temperature at which a crack is not generated in the embrittled region 104 and is performed, for example, at a temperature higher than or equal to room temperature and lower than 400° C. The oxide film 132 and the nitrogen-containing layer 121 may be bonded to each other while being heated at a temperature within the above range. This heat treatment can be performed with a diffusion furnace, a heating furnace such as a resistance heating furnace, a rapid thermal annealing (RTA) apparatus, a microwave heating apparatus, or the like.

In general, when heat treatment is performed at the same time as or after bonding of the oxide film 132 and the nitrogen-containing layer 121, a dehydration reaction at the bonding interface occurs and the bonding surfaces come closer to each other; thus, the bonding strength is increased by strengthening of hydrogen bonding and formation of covalent bonding. In order to promote the dehydration reaction, moisture generated at the bonding interface through the dehydration reaction should be removed by heat treatment at high temperature. In other words, when heat treatment after the bonding is performed at low temperature, moisture generated at the bonding interface through the dehydration reaction cannot be removed effectively; thus, the dehydration reaction does not progress and it is difficult to increase the bonding strength sufficiently.

On the other hand, in the case where an oxide film containing chlorine atoms or the like is used as the oxide film 132, the oxide film 132 can absorb and diffuse moisture. Accordingly, even when the heat treatment after bonding is performed at low temperature, moisture generated at the bonding interface through the dehydration reaction can be absorbed and diffused into the oxide film 132 and the dehydration reaction can be promoted efficiently. In that case, even when a substrate having low heat resistance such as a glass substrate is used as the base substrate 120, the bonding strength between the oxide film 132 and the nitrogen-containing layer 121 can be substantially increased. Furthermore, when plasma treatment is performed by applying a bias voltage, micropores as well as OH groups are formed in the vicinity of the surface of the oxide film 132, so that moisture can be effectively absorbed and diffused into the oxide film 132. Accordingly, the bonding strength between the oxide film 132 and the nitrogen-containing layer 121 can be increased even when heat treatment is performed at low temperature.

Figure 2D:
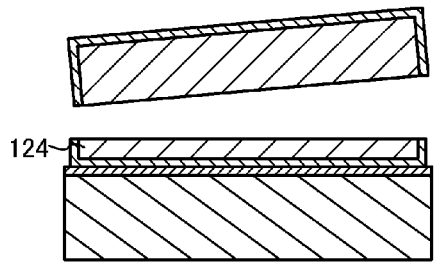
Figure 3:
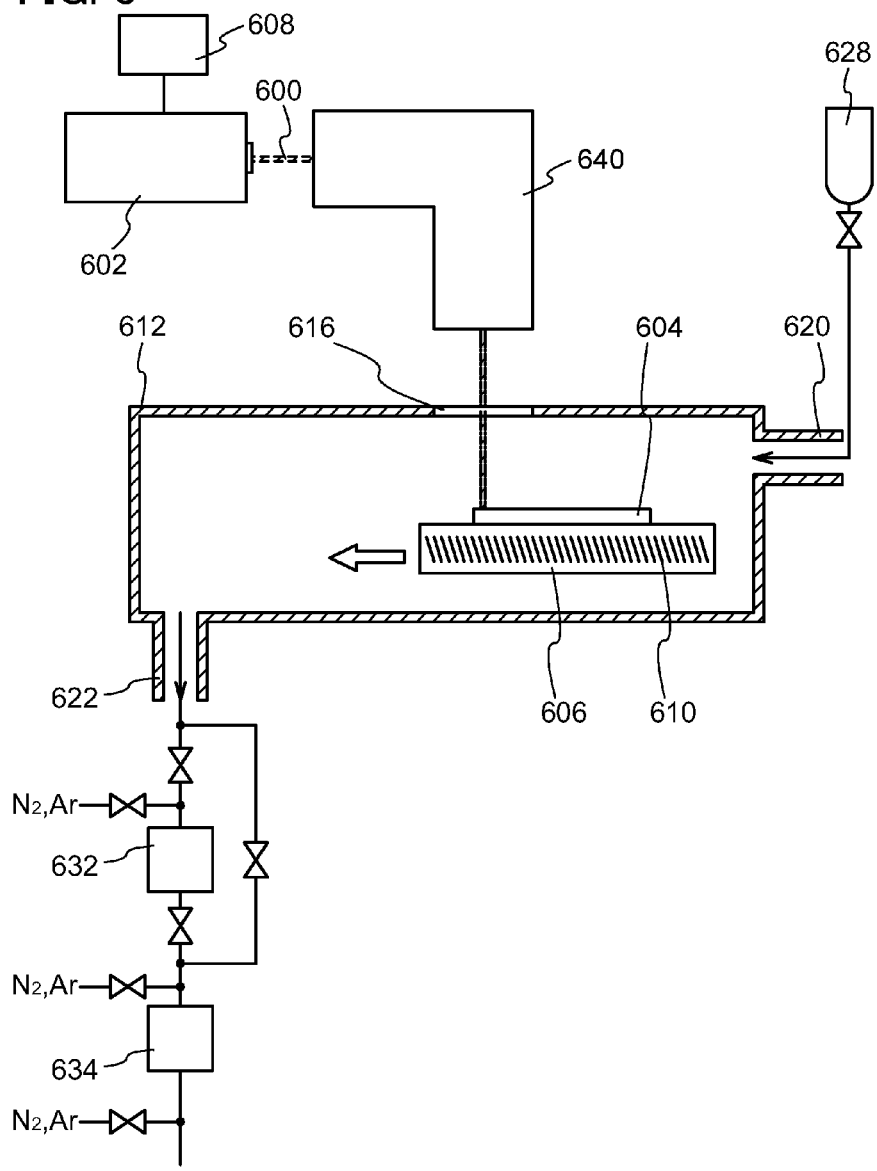

Next, heat treatment is performed to cause separation along the embrittled region 104, whereby the single crystal semiconductor layer 124 is provided over the base substrate 120 with the oxide film 132 and the nitrogen-containing layer 121 interposed therebetween (see FIG. 2D).

When the heat treatment is performed, the element added is precipitated into crystal defects formed in the embrittled region 104 by temperature increase, and the internal pressure of the crystal defects increases. The increase in pressure changes the volume of the crystal defects in the embrittled region 104 to generate cracks in the embrittled region 104, whereby the single crystal semiconductor substrate 100 is separated along the embrittled region 104. Since the oxide film 132 is bonded to the base substrate 120, the single crystal semiconductor layer 124 that is separated from the single crystal semiconductor substrate 100 is provided over the base substrate 120. This heat treatment is performed at a temperature that does not exceed the strain point of the base substrate 120, for example, at 400° C.

This heat treatment can be performed with a diffusion furnace, a heating furnace such as a resistance heating furnace, a rapid thermal annealing (RTA) apparatus, a microwave heating apparatus, or the like. For example, in the case of using a resistance heating furnace, heat treatment is performed at 200° C. for two hours and subsequently performed at 600° C. for two hours. In the case of using an RTA apparatus, heat treatment can be performed at a temperature of 550° C. to 730° C. for a process time of 0.5 minutes to 60 minutes.

Note that instead of the aforementioned heat treatment for increasing the bonding strength between the oxide film 132 and the base substrate 120, heat treatment for increasing the bonding strength between the oxide film 132 and nitrogen-containing layer 121 and heat treatment for separation along the embrittled region 104 may be performed at the same time by performing the heat treatment of FIG. 1D. Specifically, heat treatment at 600° C. for two hours with a resistance heating furnace can increase the bonding strength, repair defects in the single crystal semiconductor substrate 100 which are caused by ion irradiation, and desorb hydrogen.

Through the above steps, an SOI substrate in which the single crystal semiconductor layer 124 is provided over the base substrate 120 with the oxide film 132 and the nitrogen-containing layer 121 interposed therebetween can be manufactured. With the manufacturing method described in this embodiment, even in the case where the nitrogen-containing layer 121 is used as the bonding layer, the bonding strength between the base substrate 120 and the single crystal semiconductor layer 124 can be increased to increase reliability. In addition, the single crystal semiconductor layer 124 provided over the base substrate 120 contains a predetermined concentration of nitrogen, oxygen, or carbon; thus, the single crystal semiconductor layer 124 can be firmly bonded to the base substrate 120 and the mechanical strength of the SOI substrate can be improved.

After that, as described in the above embodiment 1, the single crystal semiconductor layer 124 is irradiated with a laser beam, whereby the crystallinity of the single crystal semiconductor layer 124 can be recovered and the element such as nitrogen is solid-dissolved in or added to the single crystal semiconductor layer 124. The laser irradiation step can be performed by utilizing the method and the apparatus described in the aforementioned embodiment. Note that the addition of nitrogen or the like to the single crystal semiconductor layer 124 may be performed in the step of adding hydrogen as described in this embodiment, in the step of laser irradiation as described in Embodiment 1, or in both of the steps.

Although the oxide film 132 is formed on the single crystal semiconductor substrate 100 and the nitrogen-containing layer 121 is formed on the base substrate 120 in this embodiment, the present invention is not limited to that case. For example, the oxide film 132 and the nitrogen-containing layer may be stacked over the single crystal semiconductor substrate 100 in this order, and then the surface of the nitrogen-containing layer formed on the oxide film 132 may be bonded to the surface of the base substrate 120. In that case, the nitrogen-containing layer may be provided before the formation of the embrittled region 104 or after the formation of the embrittled region 104. Note that an oxide film (such as a silicon oxide film) may be formed on a nitrogen-containing layer and then the surface of the oxide film may be bonded to the surface of the base substrate 120.

In the case where intrusion of impurities such as sodium into the single crystal semiconductor layer 124 from the base substrate 120 does not cause any problems, the nitrogen-containing layer 121 does not need to be provided on the base substrate 120, and the surface of the oxide film 132 provided on the single crystal semiconductor substrate 100 may be bonded to the surface of the base substrate 120.

Note that the structure shown in this embodiment can be combined with structures shown in other embodiments in this specification as appropriate.

(Embodiment 3)

In this embodiment, an apparatus for irradiating a single crystal semiconductor layer provided over a base substrate with a laser beam (a laser irradiation apparatus) will be described with reference to drawings.

The laser irradiation apparatus described in this embodiment includes a laser oscillator 602 for emitting a laser beam 600 and a stage 606 over which a processing substrate 604 is arranged (see FIG. 3). A controller 608 is connected to the laser oscillator 602. The energy, repetition rate, and the like of the laser beam 600 emitted from the laser oscillator 602 can be changed by the controller 608. Furthermore, a heating means 610 such as a resistance heating device is provided in the stage 606 so as to heat the processing substrate 604.

The stage 606 is provided inside a chamber 612. The stage 606 is provided to be able to move in the above chamber.

A part of the wall of the chamber 612 is provided with a window 616 for introducing the laser beam 600 to the processing substrate 604. The window 616 is formed of a material having a high transmittance with respect to the laser beam 600, such as quartz. In order to increase the transmittance with respect to the laser beam 600 as much as possible, the window 616 is preferably made thin.

In order to control the atmosphere in the chamber 612, a gas supply port 620 and an exhaust port 622 are provided in the chamber 612. In this embodiment, any one of nitrogen, oxygen, and carbon is contained in the atmosphere in the chamber 612. As a result, nitrogen, oxygen, or carbon is easily contained in the single crystal semiconductor layer in the laser irradiation step.

The gas supply port 620 is provided with a gas supply device 628 through a valve. Although one gas supply device 628 is provided, a plurality of gas supply devices may be provided to supply a plurality of gases into the chamber 612 at the same time.

The exhaust port 622 is provided with an exhaust system. Specifically, the exhaust port 622 is provided with a turbo pump 632 and a dry pump 634 through valves. In addition, the exhaust port 622 and the dry pump 634 are connected to each other through the valves, and therefore, rough vacuum can be created by the dry pump.

An optical system 640 including a lens, a mirror, and the like is arranged between the laser oscillator 602 and the stage 606. The optical system 640 is provided outside the chamber 612. The energy distribution of the laser beam 600 from the laser oscillator 602 is equalized by the optical system 640, and the cross-sectional shape of the laser beam 600 is processed into a linear shape or a rectangular shape. The laser beam 600 which has passed through the optical system 640 passes through the window 618, enters inside the chamber 612, and is delivered on the processing substrate 604 over the stage 606. At this time, the entire surface of the processing substrate 604 can be irradiated with the laser beam 600 by moving the stage 606. Alternatively, the laser oscillator 602 or the optical system 640 may be moved. Further alternatively, both the processing substrate 604 and one of the laser oscillator 602 and the optical system 640 may be moved. In the latter case, the processing substrate 604 and one of the laser oscillator 602 and the optical system 640 are moved in different directions (for example, one is moved in the X-axis direction and the other is moved in the Y-axis direction that is rotated from the X-axis by 90°, whereby laser irradiation can be performed efficiently.

When the processing substrate 604 is irradiated with the laser beam 600, the processing substrate 604 may be heated by the heating device in the stage 606 at a temperature equal to or lower than the strain point of glass. Furthermore, when a nitrogen gas, an oxygen gas, and a gas containing carbon as one of its components is selected as appropriate to be supplied from the gas supply port 620, the laser beam 600 can be emitted in an atmosphere containing such a gas.

In this embodiment, the concentration of nitrogen, oxygen, or carbon in the laser irradiation atmosphere is controlled by using the chamber. By employing such a method described in this embodiment, for example, the minimum concentration of nitrogen in the single crystal semiconductor layer provided over the base substrate that is the processing substrate 604 can be controlled to $5\times10^{15}$ atoms/cm$^3$ or more, preferably $1\times10^{16}$ atoms/cm$^3$ or more, and more preferably $1\times10^{17}$ atoms/cm$^3$ or more. The minimum concentration of oxygen in the single crystal semiconductor layer can be controlled to $2\times10^{18}$ atoms/cm$^3$ or more, preferably $3\times10^{18}$ atoms/cm$^3$ or more, and more preferably $5\times10^{18}$ atoms/cm$^3$ or more. Alternatively, the single crystal semiconductor layer may include a region having an oxygen concentration of $2\times10^{18}$ atoms/cm$^3$ or more, and preferably $5\times10^{18}$ atoms/cm$^3$ or more. The minimum concentration of carbon in the single crystal semiconductor layer can be controlled to $1\times10^{17}$ atoms/cm$^3$ or more, and preferably $5\times10^{17}$ atoms/cm$^3$ or more. As a result, voids in the single crystal semiconductor layer can be reduced to increase the yield stress.

Note that a too high concentration of each element may adversely affect the characteristics of a transistor using such a single crystal semiconductor layer. Therefore, it is preferable to control the concentration of each element in the single crystal semiconductor layer so that the upper limit of the concentration of nitrogen is $5\times10^{19}$ atoms/cm$^3$ or less, preferably $2\times10^{19}$ atoms/cm$^3$ or less, and more preferably $5\times10^{18}$ atoms/cm$^3$ or less, the upper limit of the concentration of oxygen is $1\times10^{20}$ atoms/cm$^3$ or less, and preferably $1\times10^{19}$ atoms/cm$^3$ or less, and the upper limit of the concentration of carbon is $5\times10^{20}$ atoms/cm$^3$ or less, and more $5\times10^{19}$ atoms/cm$^3$ or less.

As the processing substrate 604 in this embodiment, an insulating film containing at least one of nitrogen, oxygen, and carbon may be further provided on the single crystal semiconductor layer provided over the base substrate, and laser beam irradiation may be performed from a surface side of the insulating film. As the insulating film, for example, a silicon nitride film, a silicon oxide film, a silicon nitride oxide film (nitrogen>oxygen), or a silicon oxynitride film (oxygen>nitrogen) can be used. Such an insulating film may contain carbon at a concentration of about $1\times10^{17}$ atoms/cm$^3$ to $1\times10^{20}$ atoms/cm$^3$. When the laser beam irradiation may be performed from a surface side of the insulating film, the concentration of nitrogen, oxygen, or carbon can be further increased in the single crystal semiconductor layer that is re-single-crystallized. After the laser light irradiation, the insulating film can be removed with hydrofluoric acid or buffered hydrofluoric acid.

This embodiment shows an example in which the processing substrate 604 is irradiated with the laser beam by using the chamber 612; however, the chamber is not necessarily used and the processing substrate may be irradiated with the laser beam in the atmosphere while being directly sprayed with a nitrogen gas, an oxygen gas, and a gas containing carbon as one of its components. For example, when the processing substrate is sprayed with a nitrogen gas, both oxygen in the atmosphere and the nitrogen gas sprayed can be solid-dissolved in the single crystal semiconductor layer.

Note that the structure shown in this embodiment can be combined with structures shown in other embodiments in this specification as appropriate.

(Embodiment 4)

In this embodiment, a method for manufacturing a semiconductor device using the SOI substrate manufactured in the above embodiment will be described.

First, a method for manufacturing an n-channel thin film transistor and a p-channel thin film transistor will be described with reference to FIGS. 4A to 4D and FIGS. 5A to 5C. Various kinds of semiconductor devices can be formed by combining a plurality of thin film transistors (TFTs).

In this embodiment, description is made on the case where the SOI substrate manufactured through the steps of FIGS. 2A to 2D is used as an SOI substrate. Needless to say, an SOI substrate which is manufactured using any other method described in the above embodiments can be used.

Figure 4A:
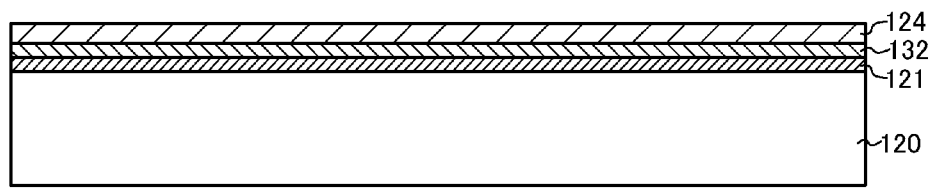
FIGS. 4A to 4D are diagrams illustrating an example of a method for manufacturing a semiconductor device using an SOI substrate.

FIG. 4A is a cross-sectional view of the SOI substrate manufactured by the method described with reference to FIGS. 2A to 2D.

Figure 4B:
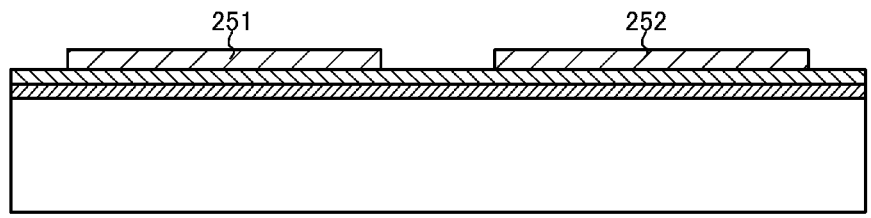

First, the singe crystal semiconductor layer 124 is divided for each element by etching to form semiconductor layers 251 and 252 as illustrated in FIG. 4B. The semiconductor layer 251 is included in an n-channel TFT, and the semiconductor layer 252 is included in a p-channel TFT.

Figure 4C:
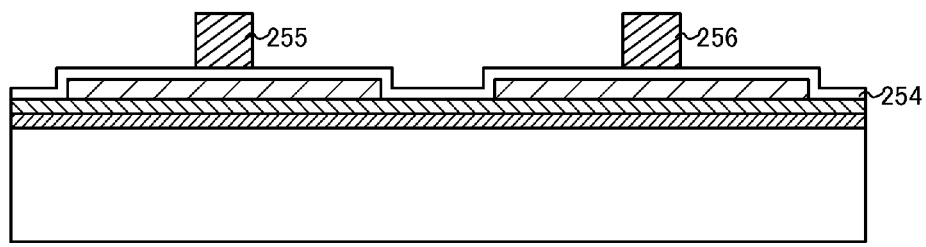

As illustrated in FIG. 4C, an insulating film 254 is formed over the semiconductor layers 251 and 252. Then, a gate electrode 255 is formed over the semiconductor layer 251 with the insulating film 254 interposed therebetween, and a gate electrode 256 is formed over the semiconductor layer 252 with the insulating film 254 interposed therebetween.

Before the single crystal semiconductor layer 124 is etched, an impurity element serving as an acceptor, such as boron, aluminum, or gallium, or an impurity element serving as a donor, such as phosphorus or arsenic, is preferably added to the single crystal semiconductor layer 124 in order to control the threshold voltage of the TFTs. For example, an impurity element serving as an acceptor is added to a region in which an n-channel TFT is to be formed, and an impurity element serving as a donor is added to a region in which a p-channel TFT is to be formed.

Figure 4D:
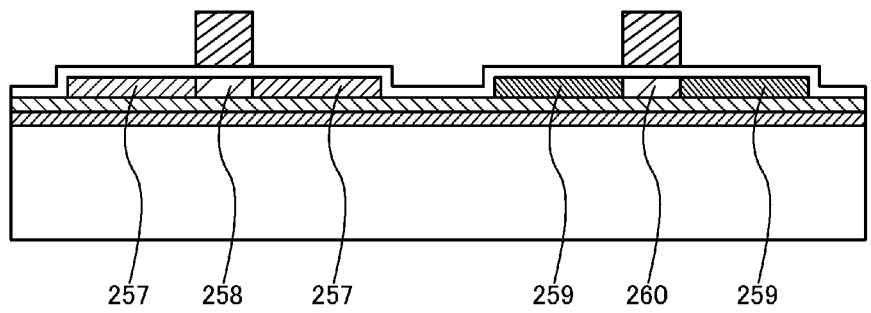

Next, as illustrated in FIG. 4D, n-type low-concentration impurity regions 257 are formed in the semiconductor layer 251, and p-type high-concentration impurity regions 259 are formed in the semiconductor layer 252. Specifically, first, the n-type low-concentration impurity regions 257 are formed in the semiconductor layer 251. In order to form the n-type low-concentration impurity regions 257, the semiconductor layer 252 where the p-channel TFT is formed is covered with a resist mask, and an impurity element is added to the semiconductor layer 251. As the impurity element, phosphorus or arsenic may be added. By adding the impurity element by an ion doping method or an ion implantation method, the gate electrode 255 functions as a mask, and the n-type low-concentration impurity regions 257 are formed in the semiconductor layer 251 in a self-aligned manner. A region of the semiconductor layer 251 that overlaps the gate electrode 255 serves as a channel formation region 258.

Next, after the mask that covers the semiconductor layer 252 is removed, the semiconductor layer 251 where the n-channel TFT is formed is covered with a resist mask. Then, an impurity element is added to the semiconductor layer 252 by an ion doping method or an ion implantation method. As the impurity element, boron may be added. In the step of adding the impurity element, the gate electrode 256 functions as a mask and the p-type high-concentration impurity regions 259 are formed in the semiconductor layer 252 in a self-aligned manner. The p-type high-concentration impurity regions 259 serve as a source region or a drain region. A region of the semiconductor layer 252 that overlaps the gate electrode 256 serves as a channel formation region 260. Here, description is made on the method in which the p-type high-concentration impurity regions 259 are formed after the n-type low-concentration impurity regions 257 are formed; however, the p-type high-concentration impurity regions 259 can be formed first.

Figure 5A:
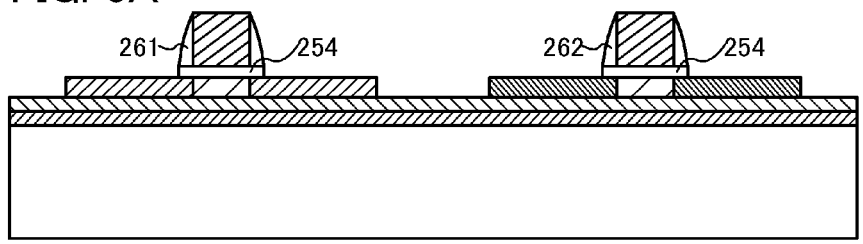
FIGS. 5A to 5C are diagrams illustrating an example of a method for manufacturing a semiconductor device using an SOI substrate.

Next, after the resist that covers the semiconductor layer 251 is removed, an insulating film having a single-layer structure or a stacked-layer structure of a nitrogen compound such as silicon nitride or an oxide such as silicon oxide is formed by plasma CVD or the like. This insulating film is anisotropically etched in a perpendicular direction to form sidewall insulating films 261 and 262 that are in contact with side surfaces of the gate electrodes 255 and 256, respectively, as illustrated in FIG. 5A. By this anisotropic etching, the insulating film 254 is also etched.

Figure 5B:
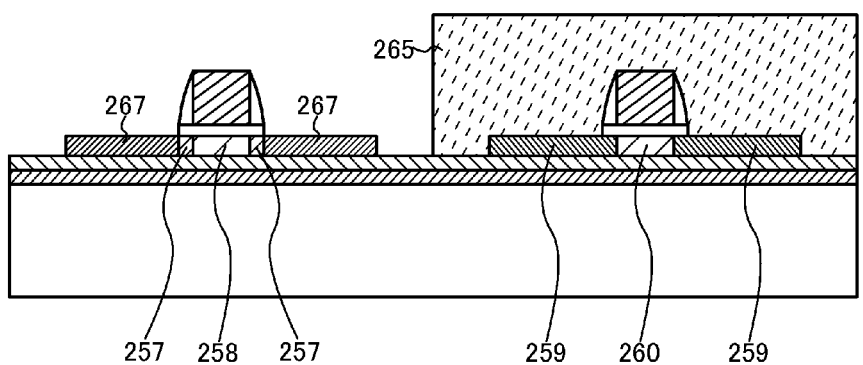

Next, as illustrated in FIG. 5B, the semiconductor layer 252 is covered with a resist 265. In order to form high-concentration impurity regions serving as a source region or a drain region in the semiconductor layer 251, an impurity element is added to the semiconductor layer 251 at high dose by an ion implantation method or an ion doping method. The gate electrode 255 and the sidewall insulating films 261 function as masks, and n-type high-concentration impurity regions 267 are formed. Then, heat treatment is performed to activate the impurity element.

Figure 5C:
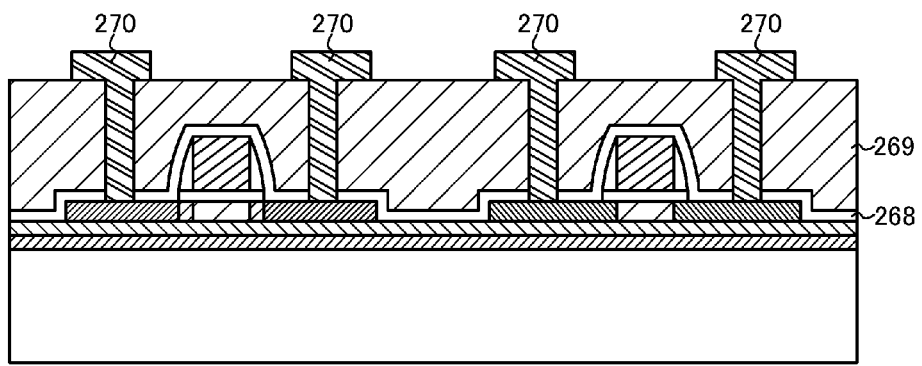

After the heat treatment for activation, an insulating film 268 containing hydrogen is formed as illustrated in FIG. 5C. After the insulating film 268 is formed, heat treatment is performed at a temperature of 350° C. to 450° C., so as to diffuse hydrogen contained in the insulating film 268 into the semiconductor layers 251 and 252. The insulating film 268 can be formed by deposition of silicon nitride or silicon nitride oxide by plasma CVD at a process temperature of 350° C. or less. The supply of hydrogen to the semiconductor layers 251 and 252 makes it possible to efficiently correct defects that are to be trapping centers in the semiconductor layers 251 and 252 and at an interface with the insulating film 254.

After that, an interlayer insulating film 269 is formed. The interlayer insulating film 269 can have a single-layer structure or a stacked-layer structure of any of films selected from an insulating film containing an inorganic material, such as a silicon oxide film or a BPSG (borophosphosilicate glass) film, and an organic resin film containing polyimide, acrylic, or the like. After contact holes are formed in the interlayer insulating film 269, wirings 270 are formed as illustrated in FIG. 5C. The wirings 270 can be formed of, for example, a conductive film having a three-layer structure in which a low-resistance metal film such as an aluminum film or an aluminum-alloy film is sandwiched between barrier metal films. The barrier metal films can be formed of molybdenum, chromium, titanium, or the like.

Through the aforementioned steps, a semiconductor device having the n-channel TFT and the p-channel TFT can be manufactured. Since the concentration of oxygen contained in the semiconductor layer in which the channel formation region is formed is reduced in the manufacturing process of the SOI substrate, a TFT with a low off current and less variations in threshold voltage can be manufactured.

Although the method for manufacturing TFTs is described with reference to FIGS. 4A to 4D and FIGS. 5A to 5C, a semiconductor device with high added value can be manufactured by forming various kinds of semiconductor elements such as a capacitor or a resistor as well as a TFT. Specific modes of semiconductor devices are described below with reference to drawings.

Figure 6:
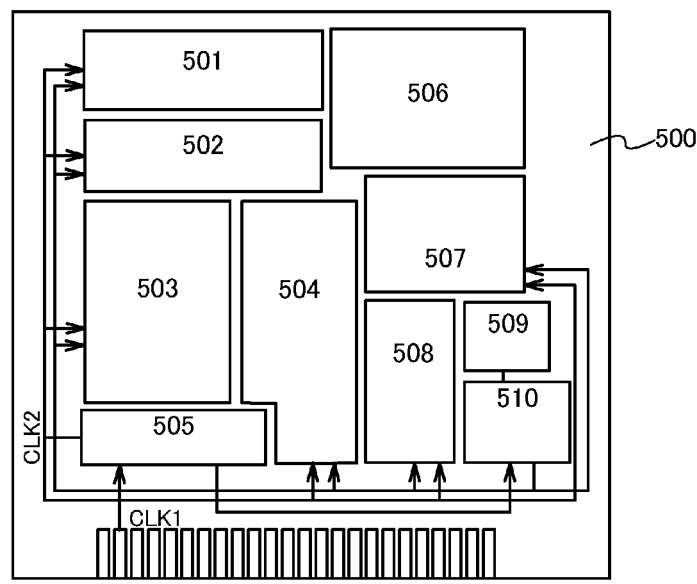
FIG. 6 is a diagram illustrating an example of a semiconductor device using an SOI substrate.

First, as an example of the semiconductor device, a microprocessor is described. FIG. 6 is a block diagram illustrating a structural example of a microprocessor 500.

The microprocessor 500 includes an arithmetic logic unit (ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface 510.

Instructions input to the microprocessor 500 via the bus interface 508 are input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instructions.

The ALU controller 502 generates signals for controlling the operation of the ALU 501. While the microprocessor 500 is executing a program, the interrupt controller 504 judges and processes an interrupt request from an external input/output device or a peripheral circuit based on its priority or a mask state. The register controller 507 generates an address of the register 506, and reads/writes data from/to the register 506 in accordance with the state of the microprocessor 500. The timing controller 505 generates signals for controlling the timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 6, the internal clock signal CLK2 is input to other circuits.

Figure 7:
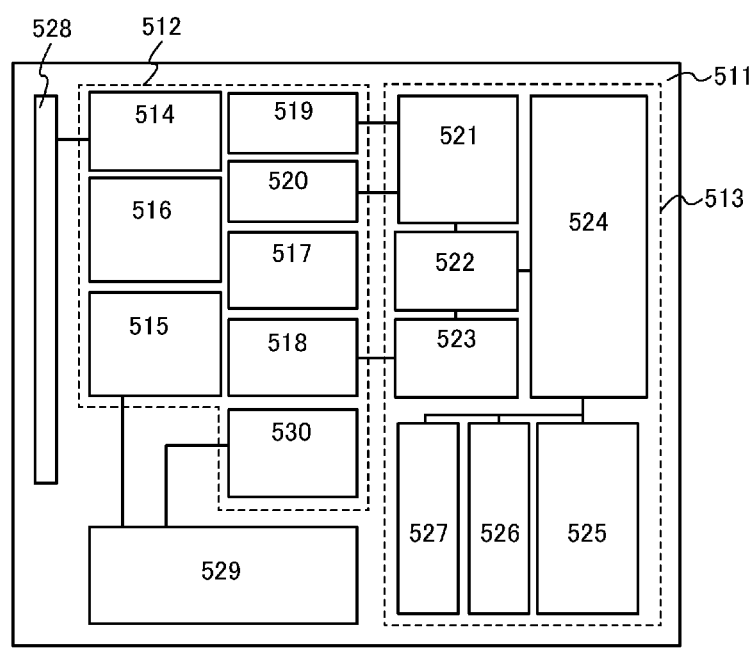
FIG. 7 is a diagram illustrating an example of a semiconductor device using an SOI substrate.

Next, an example of a semiconductor device having an arithmetic function and a function of communicating data wirelessly will be described. FIG. 7 is a block diagram illustrating a structural example of such a semiconductor device. The semiconductor device illustrated in FIG. 7 can be referred to as a computer (hereinafter referred to as an RFCPU) that operates by transmitting/receiving signals to/from an external device by wireless communication.

As illustrated in FIG. 7, an RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, an interface 524, a central processing unit 525, a random access memory 526, and a read only memory 527.

The operation of the RFCPU 511 is roughly described below. The resonance circuit 514 generates induced electromotive force based on a signal received by an antenna 528. The induced electromotive force is stored in a capacitor portion 529 via the rectifier circuit 515. The capacitor portion 529 preferably includes a capacitor such as a ceramic capacitor or an electric double layer capacitor. The capacitor portion 529 is not necessarily integrated over the same substrate as the RFCPU 511 and may be incorporated into the RFCPU 511 as another component.

The reset circuit 517 generates a signal that resets and initializes the digital circuit portion 513. For example, a signal that rises after an increase in power supply voltage is generated as the reset signal. The oscillator circuit 518 changes the frequency and duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 includes a low-pass filter and binarizes a received signal of an amplitude shift keying (ASK) system based on the variation of the amplitude. The modulation circuit 520 transmits data by changing the amplitude of a transmission signal of the amplitude shift keying (ASK) system. Thus, the modulation circuit 520 changes the resonance point of the resonance circuit 514, thereby varying the amplitude of a communication signal.

The clock controller 523 generates a control signal for changing the frequency and duty ratio of the clock signal in accordance with the power supply voltage or the current consumption in the central processing unit 525. The power supply voltage is monitored by a power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the interface 524. The interface 524 has a function of generating an access signal to any one of the read only memory 527, the random access memory 526, and the control register 522 based on an address requested by the central processing unit 525.

As an arithmetic method of the central processing unit 525, a method may be employed in which an OS (operating system) is stored in the read only memory 527 and a program is read and executed at the time of starting operation. Alternatively, a method may also be employed in which a circuit dedicated to arithmetic is formed and an arithmetic process is conducted using hardware. In a method using both hardware and software, part of arithmetic process can be conducted by a circuit dedicated to arithmetic, and the other part of the arithmetic process can be conducted by the central processing unit 525 using a program.

Next, display devices will be described with reference to FIGS. 8A and 8B, and FIGS. 9A and 9B.

Figure 8A:
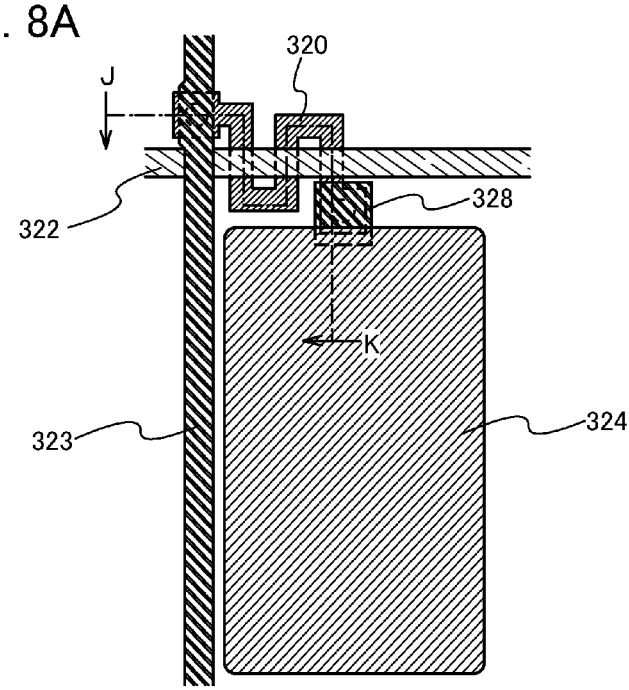
FIGS. 8A and 8B are diagrams illustrating an example of a display device using an SOI substrate.
Figure 8B:
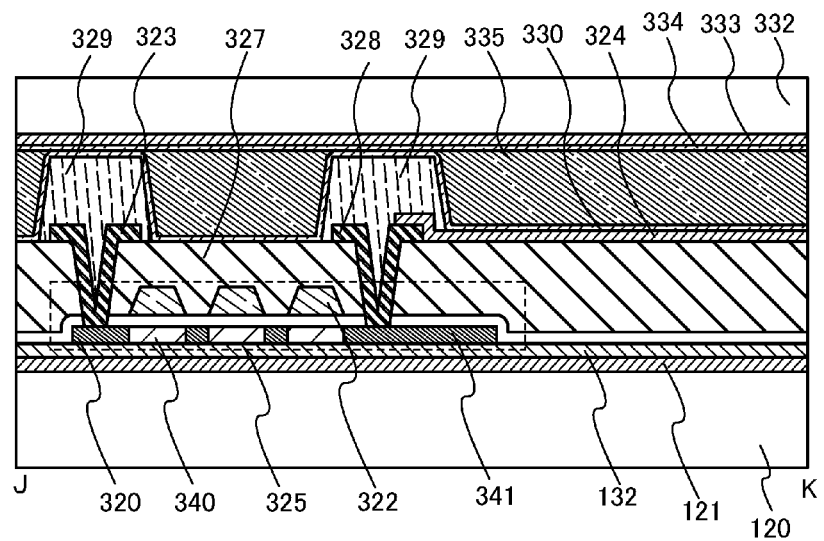

FIGS. 8A and 8B are drawings for describing a liquid crystal display device. FIG. 8A is a plan view of a pixel of the liquid crystal display device, and FIG. 8B is a cross-sectional view taken along line J-K of FIG. 8A.

As illustrated in FIG. 8A, a pixel includes a single crystal semiconductor layer 320, a scanning line 322 intersecting with the single crystal semiconductor layer 320, a signal line 323 intersecting with the scanning line 322, a pixel electrode 324, and an electrode 328 that electrically connects the pixel electrode 324 to the single crystal semiconductor layer 320.

The single crystal semiconductor layer 320 is a layer formed using the single crystal semiconductor layer provided over the base substrate 120 and is included in a TFT 325 of the pixel.

As an SOI substrate, the SOI substrate described in the above embodiments is used. As illustrated in FIG. 8B, the single crystal semiconductor layer 320 is stacked over the base substrate 120 with the oxide film 132 and the nitrogen-containing layer 121 interposed therebetween. A glass substrate can be used as the base substrate 120. The single crystal semiconductor layer 320 of the TFT 325 is a film that is obtained by etching the single crystal semiconductor layer of the SOI substrate. A channel formation region 340 and n-type high-concentration impurity regions 341 to which an impurity element is added are formed in the single crystal semiconductor layer 320. A gate electrode of the TFT 325 is included in the scanning line 322 and one of a source electrode and a drain electrode of the TFT 325 is included in the signal line 323.

The signal line 323, the pixel electrode 324, and the electrode 328 are provided over an interlayer insulating film 327. Columnar spacers 329 are formed over the interlayer insulating film 327. An orientation film 330 is formed to cover the signal line 323, the pixel electrode 324, the electrode 328, and the columnar spacers 329. A counter substrate 332 is provided with a counter electrode 333 and an orientation film 334 that covers the counter electrode 333. The columnar spacers 329 are formed to maintain the space between the base substrate 120 and the counter substrate 332. A liquid crystal layer 335 is formed in the space formed by the columnar spacers 329. At connection portions of the signal line 323 and the electrode 328 with the high-concentration impurity regions 341, there are steps formed in the interlayer insulating film 327 due to formation of contact holes; thus, liquid crystal orientation in the liquid crystal layer 335 at these connection portions is likely to be disordered. Therefore, the columnar spacers 329 are formed at these steps to prevent the liquid crystal orientation from being disordered.

Figure 9A:
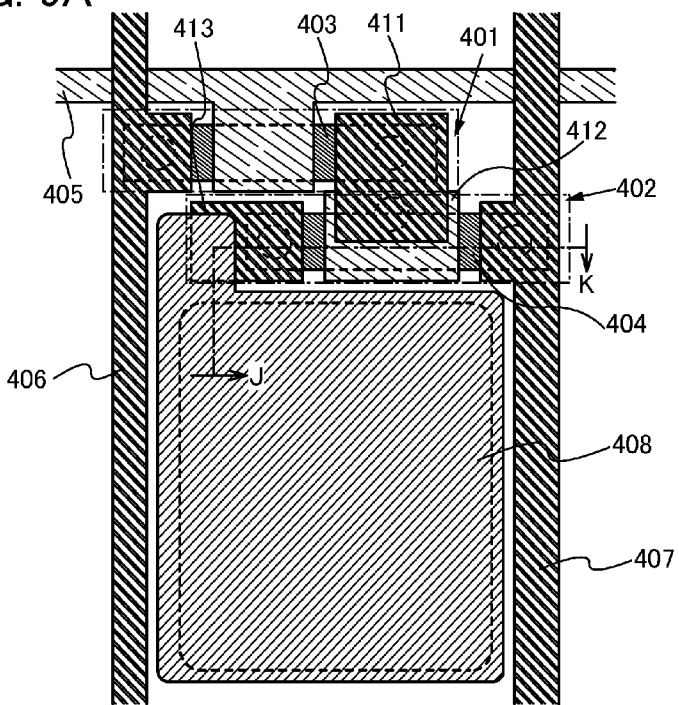
FIGS. 9A and 9B are diagrams illustrating an example of a display device using an SOI substrate.
Figure 9B:
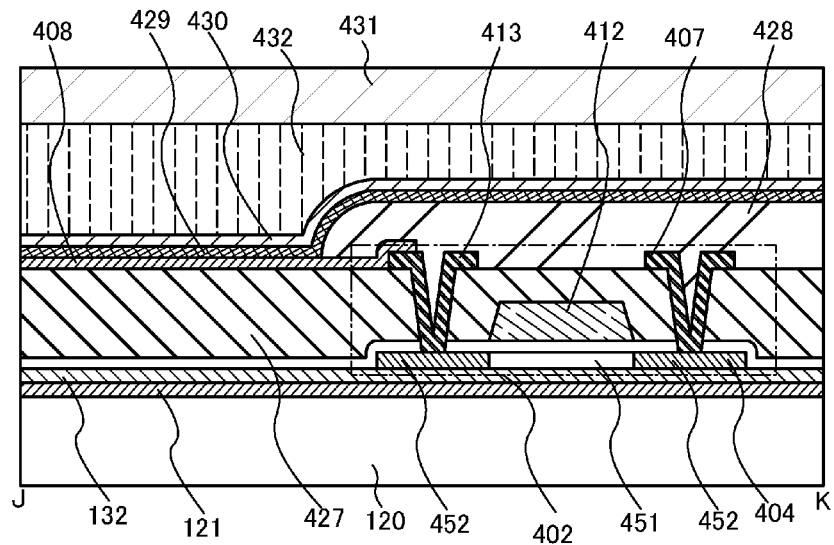

Next, an electroluminescence display device (hereinafter referred to as an EL display device) will be described with reference to FIGS. 9A and 9B. FIG. 9A is a plan view of a pixel of the EL display device, and FIG. 9B is a cross-sectional view taken along line J-K of FIG. 9A.

As illustrated in FIG. 9A, a pixel includes a TFT as a selection transistor 401, a TFT as a display control transistor 402, a scanning line 405, a signal line 406, a current supply line 407, and a pixel electrode 408. In the EL display device, each pixel is provided with a light-emitting element having a structure in which a layer containing an electroluminescent material (an EL layer) is sandwiched between a pair of electrodes. One electrode of the light-emitting element is the pixel electrode 408. Furthermore, a semiconductor layer 403 includes a channel formation region, a source region, and a drain region of the selection transistor 401. A semiconductor layer 404 includes a channel formation region, a source region, and a drain region of the display control transistor 402. The semiconductor layers 403 and 404 are layers that are formed using the single crystal semiconductor layer 124 provided over the base substrate.

In the selection transistor 401, a gate electrode is included in the scanning line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 that is electrically connected to the pixel electrode 408, and the other thereof is included in the current supply line 407.

The display control transistor 402 is a p-channel TFT. As illustrated in FIG. 9B, a channel formation region 451 and p-type high-concentration impurity regions 452 are formed in the semiconductor layer 404. Note that as an SOI substrate, the SOI substrate manufactured in the aforementioned embodiments is used.

An interlayer insulating film 427 is formed to cover the gate electrode 412 of the display control transistor 402. The signal line 406, the current supply line 407, the electrode 411, the electrode 413, and the like are formed over the interlayer insulating film 427. The pixel electrode 408 that is electrically connected to the electrode 413 is formed over the interlayer insulating film 427. A peripheral portion of the pixel electrode 408 is surrounded by a partition wall layer 428 having an insulating property. The EL layer 429 is formed over the pixel electrode 408, and a counter electrode 430 is formed over the EL layer 429. A counter substrate 431 is provided as a reinforcing plate and fixed to the base substrate 120 by a resin layer 432.

The gray scale of the EL display device can be controlled by a current driving method in which the luminance of a light-emitting element is controlled by current or a voltage driving method in which the luminance of a light-emitting element is controlled by voltage. In the case where the transistors of different pixels have largely different characteristic values, it is difficult to employ the current driving method; in order to employ the current driving method in such a case, a correction circuit for correcting characteristic variations is needed. When the EL display device is manufactured by a method including manufacturing steps of an SOI substrate, the selection transistor 401 and the display control transistor 402 do not have variations in characteristics in different pixels. Thus, the current driving method can be employed.

That is, a variety of electronic devices can be manufactured using the SOI substrate. The electronic devices include, in its category, cameras such as video cameras and digital cameras, navigation systems, audio reproducing devices (such as car audio sets and audio components), computers, game machines, portable information terminals (such as mobile computers, cellular phones, portable game machines, and e-book readers), and image reproducing devices having recording media (specifically, devices provided with display devices capable of playing audio data stored in recording media such as a digital versatile disc (DVD) and displaying stored image data). An example of them is illustrated in FIGS. 10A to 10C.

Figure 10A:
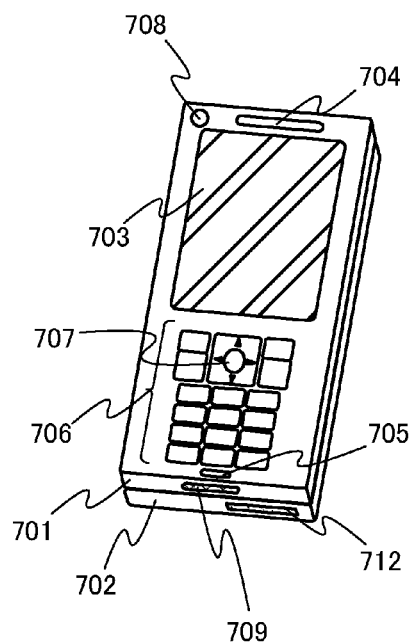
FIGS. 10A to 10C are views illustrating an electronic device using an SOI substrate.
Figure 10B:
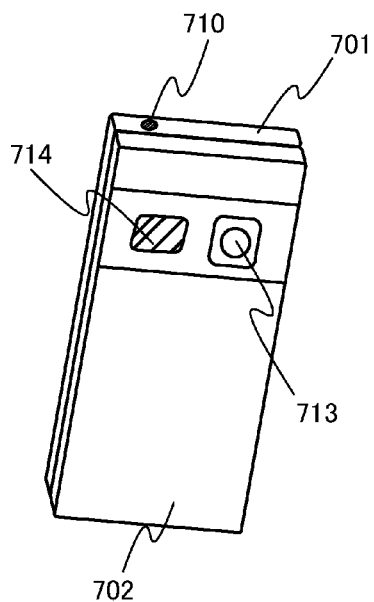
Figure 10C:
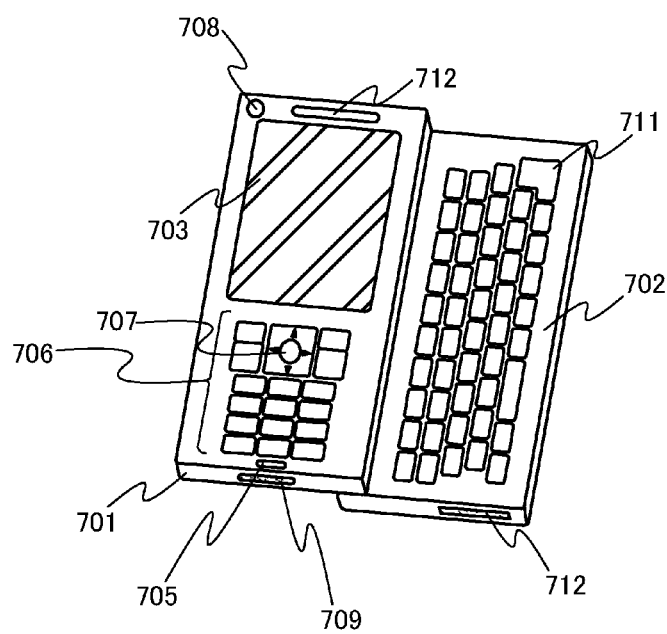

FIGS. 10A to 10C illustrate an example of a cellular phone to which an embodiment of the invention disclosed in this specification is applied. FIG. 10A is a front view, FIG. 10B is a rear view, and FIG. 10C is a front view in which two housings are slid. A cellular phone 700 includes two housings: a housing 701 and a housing 702. The cellular phone 700 is a so-called smartphone that has both functions of a cellular phone and a portable information terminal and incorporates a computer, and thus is capable of a variety of data processing in addition to voice calls.

The cellular phone 700 includes the housing 701 and the housing 702. The housing 701 includes a display portion 703, a speaker 704, a microphone 705, operation keys 706, a pointing device 707, a front camera lens 708, a jack 709 for an external connection terminal, an earphone terminal 710, and the like. The housing 702 includes a keyboard 711, an external memory slot 712, a rear camera 713, a light 714, and the like. In addition, an antenna is incorporated in the housing 701.

Furthermore, in addition to the above structure, a wireless IC chip, a small memory device, or the like may be incorporated in the cellular phone 700.

The housings 701 and 702 that overlap each other (see FIG. 10A) can be slid, and are developed by being slid as illustrated in FIG. 10C. The display panel or the display device that is manufactured by the methods for manufacturing a display device described in Embodiments 2 and 3 can be incorporated in the display portion 703. Since the front camera lens 708 is provided in the same plane as the display portion 703, the cellular phone 700 can be used as a videophone. Furthermore, by using the display portion 703 as a viewfinder, still images and moving images can be taken with the rear camera 713 and the light 714.

By using the speaker 704 and the microphone 705, the cellular phone 700 can be used as an audio recording device (a recording device) or an audio reproducing device. In addition, with the use of the operation keys 706, it is possible to perform operations of incoming and outgoing of calls, simple information input such as e-mails, scrolling of a screen to be displayed on the display portion, cursor movement, e.g., for selecting information to be displayed on the display portion, and the like.

If a large amount of information needs to be treated in documentation, in the use as a portable information terminal, and the like, it is convenient to use the keyboard 711. By sliding the housings 701 and 702 that overlap each other (FIG. 10A), the housings 701 and 702 can be developed as illustrated in FIG. 10C. In using the cellular phone 700 as a portable information terminal, a cursor can be moved smoothly with the use of the keyboard 711 and the pointing device 707. The jack 709 for an external connection terminal can be connected to an AC adapter or a variety of cables such as a USB cable, thereby performing charging and data communication with a personal computer or the like. Furthermore, by inserting a recording medium into the external memory slot 712, a larger amount of data can be stored and moved.

The rear face of the housing 702 (FIG. 10B) is provided with the rear camera 713 and the light 714, and still images and moving images can be taken using the display portion 703 as a viewfinder.

Furthermore, in addition to the above functions and structures, the cellular phone 700 may have an infrared communication function, a USB port, a function of receiving one segment television broadcast, a wireless IC chip, an earphone jack, or the like.

The electronic device described with reference to FIGS. 10A to 10C can be manufactured by any of the aforementioned methods for manufacturing a transistor and a display device.

Note that the structure shown in this embodiment can be combined with structures shown in other embodiments in this specification as appropriate.

EXAMPLE 1

Figure 11A:
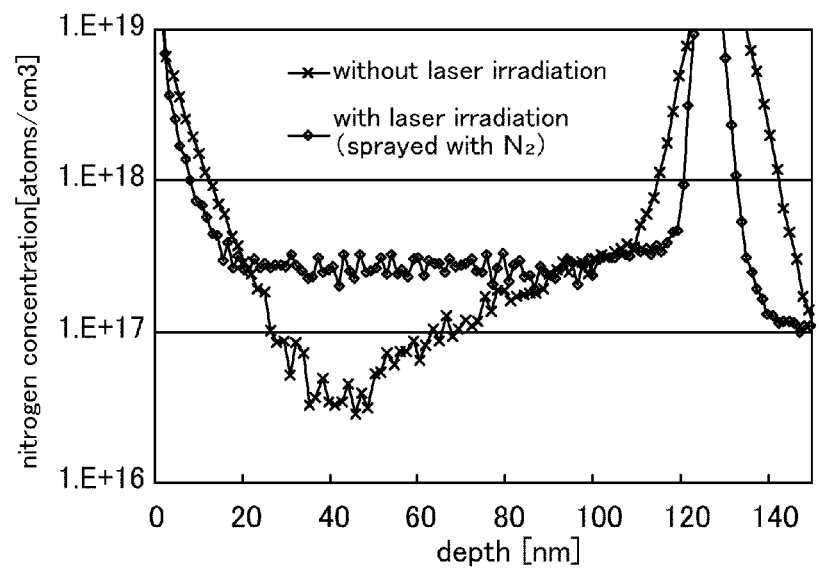
FIGS. 11A and 11B are graphs each showing an example of the experiment result of the element concentration in an SOI substrate with and without laser irradiation.
Figure 11B:
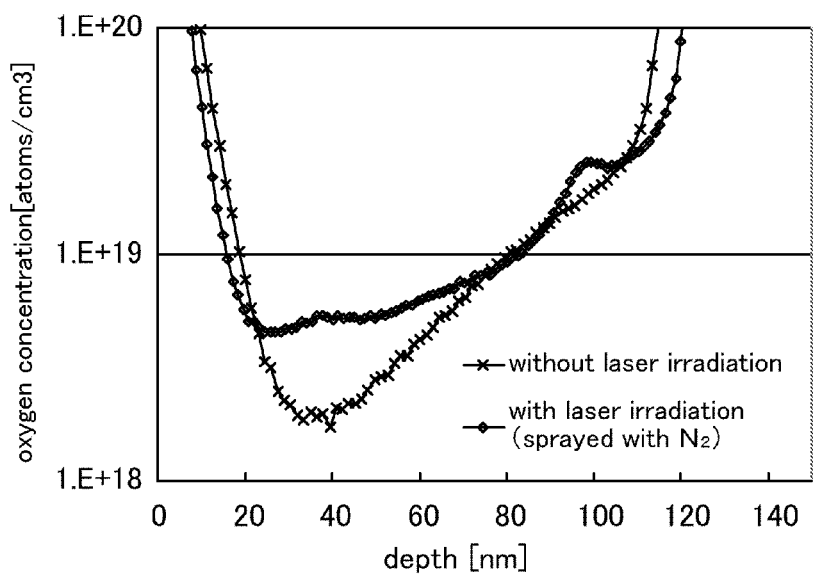

In this example, an example of the result of a measurement of the concentration of nitrogen and oxygen in a single crystal semiconductor layer that can be used in Embodiment 1 will be shown in FIGS. 11A and 11B. Specifically, FIGS. 11A and 11B show the concentration distribution of nitrogen and oxygen in the depth direction of an SOI substrate in which a single crystal silicon layer is provided over a base substrate with a silicon oxide film interposed therebetween, in the case where laser irradiation is performed or not. FIG. 11A shows the concentration distribution of nitrogen and FIG. 11B shows the concentration distribution of oxygen.

The thickness of the single crystal silicon layer was set to about 130 nm, and the measurement was performed by a SIMS apparatus (PHI ADEPT-1010 manufactured by ULVAC-PHI, Incorporated). The measurement was performed with $Cs^+$ as primary ions, an acceleration voltage of 5.0 kV, a detection region of $140\,\mu m \times 140\,\mu m$, and a sputtering rate of 0.3 nm/sec, and electron-beam irradiation was performed to compensate the surface charge build-up.

The laser beam was emitted in the following manner.

A stage for supporting the base substrate, which was kept at room temperature, was sprayed with a nitrogen gas. At the same time, a sample was irradiated with a XeCl excimer laser beam emitted from a laser oscillator (LAMBDA STEEL 670 manufactured by Lambda Physik Co., Ltd.), which had a repetition rate of 30 Hz, a pulse width of $22\pm5$ nsec, an energy density of 697 $mJ/cm^2$, and a wavelength of 308 nm The sample was scanned at a rate of 1 mm/sec., and each part of the sample was irradiated with the laser beam 10 times.

In a region of the single crystal silicon layer from the surface to a depth of about 10 nm, each concentration of oxygen and nitrogen measured by SIMS can be detected to be higher due to surface roughness of the single crystal silicon layer, knock-on effect, or a gas component remaining in the atmosphere, and thus an accurate concentration in the layer cannot always be detected. Furthermore, in a region from a depth of 120 nm to a depth of 140 nm, the single crystal silicon layer cannot be completely isolated from the silicon oxide film provided under the single crystal silicon layer, and the concentration of the silicon oxide film is also likely to be detected.

In a region from a depth of 20 nm to 70 nm in FIGS. 11A and 11B, a sample that is not irradiated with a laser beam has a nitrogen concentration of about $3 \times 10^{16}$ $atoms/cm^3$ to $3 \times 10^{17}$ $atoms/cm^3$, and an oxygen concentration of about $2 \times 10^{18}$ $atoms/cm^3$ to $1 \times 10^{19}$ $atoms/cm^3$. On the other hand, in the case where a sample is irradiated with a laser beam while being sprayed with a nitrogen gas, a constant concentration value is obtained: the concentration of nitrogen in the thickness direction is about $2 \times 10^{17}$ $atoms/cm^3$, and the concentration of oxygen in the thickness direction is about $5 \times 10^{18}$ $atoms/cm^3$ to $1 \times 10^{19}$ $atoms/cm^3$.

When a high concentration of nitrogen and oxygen is contained in the depth direction of the single crystal silicon layer, nitrogen atoms and oxygen atoms are trapped in the dislocation to fix the dislocation, whereby the yield stress of the entire single crystal silicon layer can be increased. The atoms are trapped in the dislocation not only in a step of cooling after laser light irradiation but also in a heat treatment step in a manufacturing process of a device. The nitrogen atoms can also prevent a change in the shape of voids in a single crystal semiconductor layer and reduce the size of the voids. In FIGS. 11A and 11B, the sample is sprayed with a nitrogen gas in the atmosphere; thus, oxygen in the atmosphere is contained in the single crystal silicon layer in addition to nitrogen. Accordingly, the concentration of oxygen increases as shown in FIG. 11B.

As for a sample that is not irradiated with a laser beam, nitrogen and oxygen are added when a single crystal silicon substrate is doped with hydrogen to form an embrittled region. Thus, nitrogen with a concentration of $1 \times 10^{16}$ $atoms/cm^3$ or more and oxygen with a concentration of $2 \times 10^{18}$ $atoms/cm^3$ or more are contained in the single crystal silicon layer, and a sufficient mechanical strength can be obtained.

Although an example of using a single crystal silicon layer is shown in FIGS. 11A and 11B, a similar phenomenon can be observed even in the case of using other single crystal semiconductor thin films. Thus, the concentrations of nitrogen and oxygen in the single crystal semiconductor layer can be equalized and increased by laser light irradiation, which allows the crystallinity of the single crystal semiconductor layer to be recovered and the mechanical strength to be improved.

EXAMPLE 2

Figure 12:
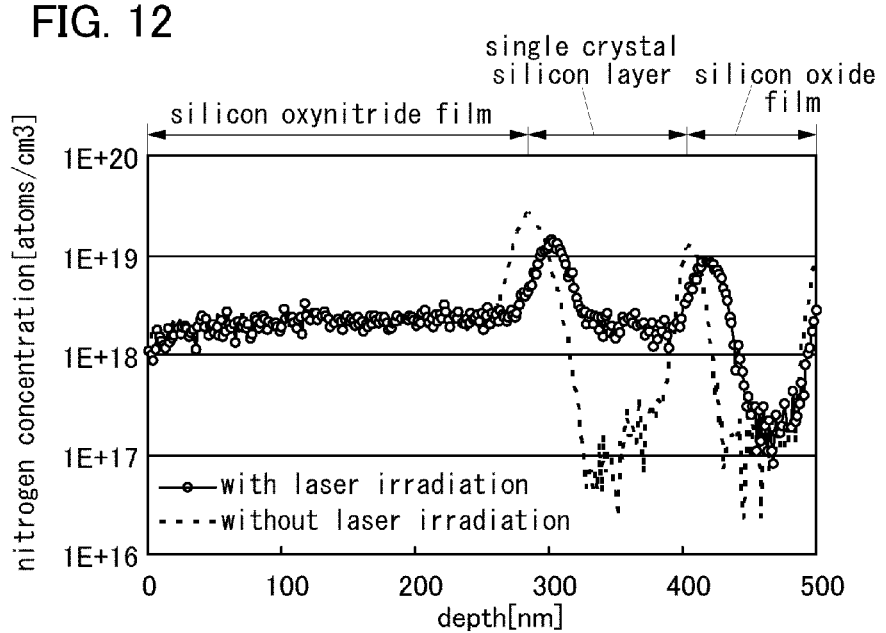
FIG. 12 is a graph showing an example of the experiment result of the element concentration in an SOI substrate with and without laser irradiation.

In Example 1, an example of directly irradiating the surface of a single crystal silicon layer with a laser beam is shown. In this example, FIG. 12 shows an example of the result of a measurement of the concentration of nitrogen in the case where a silicon oxynitride film is provided on a single crystal semiconductor layer. Specifically, FIG. 12 shows the concentration distribution of nitrogen in the depth direction of an SOI substrate in which a single crystal silicon layer is provided over a base substrate with a silicon oxide film interposed therebetween and a silicon oxynitride film is further provided on the single crystal silicon layer, in the case where laser irradiation is performed or not.

The measurement was performed by a SIMS apparatus (PHI ADEPT-1010 manufactured by ULVAC-PHI, Incorporated). The measurement was performed with Cs$^+$ as primary ions, an acceleration voltage of 5.0 kV, a detection region of 60 μm×77 μm, and a sputtering rate of 0.4 nm/sec., and electron-beam irradiation was performed to compensate the surface charge build-up. The thickness of the single crystal silicon layer was set to about 130 nm and the thickness of the silicon oxynitride film was set to about 280 nm.

The laser light was emitted in the following manner.

A stage for supporting the base substrate, which was kept at room temperature, was sprayed with a nitrogen gas. At the same time, a sample was irradiated with a XeCl excimer laser beam emitted from a laser oscillator (LAMBDA STEEL 670 manufactured by Lambda Physik Co., Ltd.,), which had a repetition rate of 30 Hz, a pulse width of 22±5 nsec, an energy density of 689.4 mJ/cm$^2$, and a wavelength of 308 nm Each part of the sample was irradiated with the laser beam 10 times.

In a sample that was not irradiated with a laser beam, the concentration of nitrogen in the single crystal silicon layer was $1\times10^{16}$ atoms/cm$^3$ or more. In a sample that was irradiated with a laser beam, the concentration of nitrogen in the single crystal silicon layer was $1\times10^{18}$ atoms/cm$^3$ or more. By irradiating the single crystal silicon layer with a laser beam after the formation of the silicon oxynitride film, nitrogen in the silicon oxynitride film is solid-dissolved in or added to the single crystal silicon layer when the surface of the single crystal silicon layer is melted. Accordingly, the single crystal silicon layer can contain nitrogen at a high concentration of $1\times10^{18}$ atoms/cm$^3$ or more. Note that also in the sample that is not irradiated with a laser beam, nitrogen is added when a single crystal silicon substrate is doped with hydrogen to form an embrittled region; thus, nitrogen with a concentration of $1\times10^{16}$ atoms/cm$^3$ or more is contained in the single crystal silicon layer, and a sufficient mechanical strength can be obtained.

Although an example of using a single crystal silicon layer is shown in FIG. 12, a similar phenomenon can be observed even in the case of using other single crystal semiconductor thin films. Thus, the concentration of nitrogen in the single crystal semiconductor layer can be equalized and increased by laser light irradiation, which allows the crystallinity of the single crystal semiconductor layer to be recovered and the mechanical strength to be improved.

EXAMPLE 3

Figure 13A:
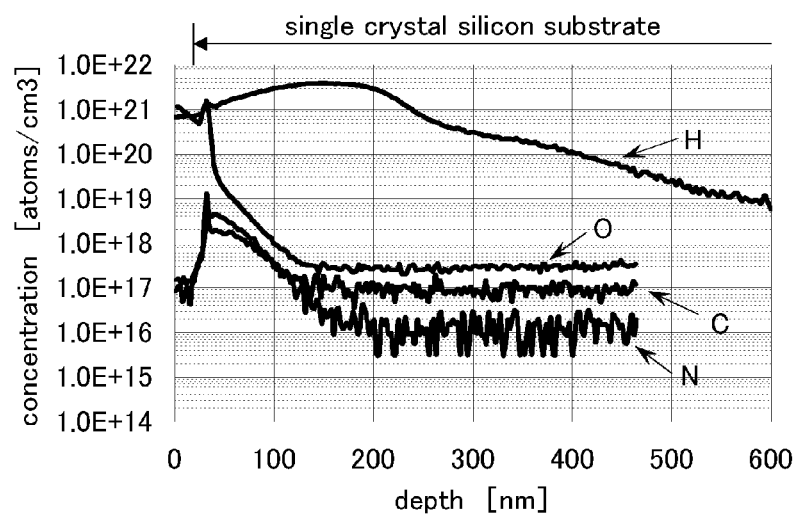
FIGS. 13A and 13B are graphs each showing an example of the experiment result of the element concentration in an SOI substrate doped with hydrogen.
Figure 13B:
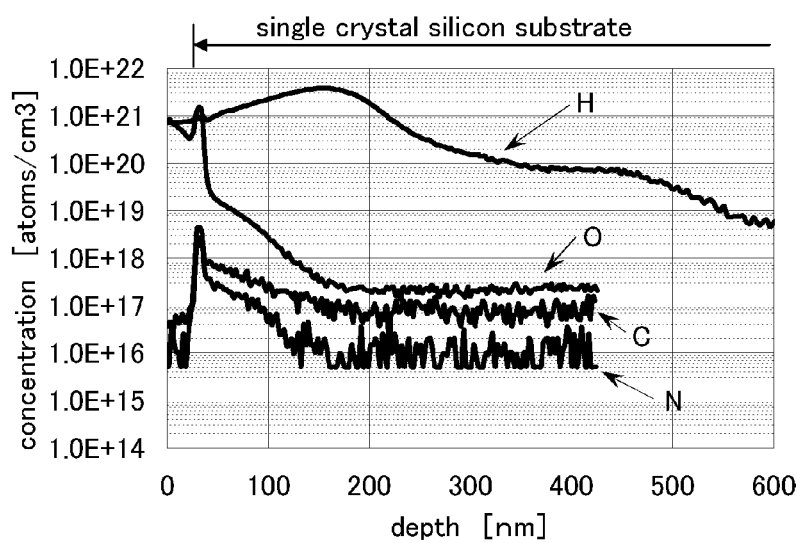

This example shows the case where nitrogen, oxygen, and carbon as well as hydrogen are added to a single crystal silicon substrate including a silicon oxide film formed by thermal oxidation. FIGS. 13A and 13B show the result of a measurement of the concentrations of hydrogen, nitrogen, oxygen, and carbon in the single crystal silicon substrate.

The measurement of hydrogen in FIGS. 13A and 13B was performed by a SIMS apparatus (Physical Electronics PHI 6650 manufactured by ULVAC-PHI, Incorporated). The measurement was performed with Cs$^+$ as primary ions, an acceleration voltage of 5.0 kV, a detection region of 60 μm×77 μm, and a sputtering rate of 0.9 nm/sec., and electron-beam irradiation was performed to compensate the surface charge build-up.

The measurement of nitrogen, oxygen, and carbon was performed by a SIMS apparatus (PHI ADEPT 1010 manufactured by ULVAC-PHI, Incorporated). The measurement was performed with Cs$^+$ as primary ions, an acceleration voltage of 5.0 kV, a detection region of 90 μm×90 μm, and a sputtering rate of 0.5 nm/sec., and electron-beam irradiation was performed to compensate the surface charge build-up. The thickness of the silicon oxide film on the single crystal silicon substrate was set to about 100 nm. It is noted that in FIGS. 13A and 13B, the measurement was performed from the back surface of the single crystal silicon substrate in order to prevent effects of detecting components in silicon oxide on the single crystal silicon substrate as much as possible. After the single crystal silicon substrate was polished to a predetermined thickness, the measurement was performed from the back surface of the single crystal silicon substrate and finished beyond the boundary between the silicon oxide film and the single crystal silicon substrate. Therefore, silicon oxide is present in a region from a depth of 0 nm to a depth of 40 nm in FIGS. 13A and 13B.

Doping conditions are different between FIG. 13A and FIG. 13B. In FIG. 13A, hydrogen was introduced at a flow rate of 24 sccm, and ions were extracted from plasma generated by RF discharge and accelerated at an acceleration voltage of 40 kV. In FIG. 13B, hydrogen was introduced at a flow rate of 50 sccm, and ions were extracted from plasma generated by filament discharge and accelerated at an acceleration voltage of 50 kV.

FIG. 13A shows that nitrogen, oxygen, and carbon are added with a gentle concentration gradient in the depth direction of the single crystal silicon substrate from the boundary between the silicon oxide film and the single crystal silicon substrate to a depth of about 120 nm The hydrogen concentration has a peak at about 150 nm, and a high concentration of nitrogen, oxygen, and carbon was able to be added in a region that is separated from the single crystal silicon substrate later to be a single crystal silicon layer.

FIG. 13B shows that nitrogen, oxygen, and carbon are added with a gentle concentration gradient in the depth direction of the single crystal silicon substrate from the boundary between the silicon oxide film and the single crystal silicon substrate to a depth of about 180 nm. The hydrogen concentration has a peak at about 150 nm, which is the same as in FIG. 13A, and nitrogen, oxygen, and carbon was able to be added at a higher concentration than in the case of FIG. 13B in a region that is separated from the single crystal silicon substrate later to be a single crystal silicon layer.

This application is based on Japanese Patent Application serial No. 2008-271676 filed with Japan Patent Office on Oct. 22, 2008, the entire contents of which are hereby incorporated by reference.

What is claimed is:

1. A method for manufacturing an SOI substrate, comprising the steps of:
    adding hydrogen to a single crystal semiconductor substrate so that an embrittled region is formed in a region at a predetermined depth from a surface of the single crystal semiconductor substrate;
    bonding the single crystal semiconductor substrate to a base substrate with an insulating layer interposed therebetween;
    heating the single crystal semiconductor substrate to be separated along the embrittled region, whereby a semiconductor layer is provided over the base substrate with the insulating layer interposed therebetween; and
    melting at least a superficial part of the semiconductor layer,
    wherein oxygen is added to the semiconductor layer in the melting step so that the semiconductor layer includes a region having an oxygen concentration of $2\times10^{18}$ atoms/cm$^3$ or more.

2. The method for manufacturing an SOI substrate, according to claim 1, wherein nitrogen is added to the semiconductor layer when the semiconductor layer is melted, so that a concentration of nitrogen in the semiconductor layer is $5\times10^{15}$ atoms/cm$^3$ or more.

3. The method for manufacturing an SOI substrate according to claim 1, wherein carbon is further added to the semiconductor layer in the melting step, so that a concentration of carbon in the semiconductor layer is $1\times10^{17}$ atoms/cm$^3$ or more.

4. The method for manufacturing an SOI substrate according to claim 1, wherein melting is performed by irradiating the semiconductor layer with a laser beam.

5. The method for manufacturing an SOI substrate according to claim 1, wherein melting is performed by strong light irradiation with a lamp.

6. The method for manufacturing an SOI substrate according to claim 1, wherein the superficial part of the semiconductor layer is melted while being sprayed with a gas containing at least one of nitrogen, oxygen, and carbon.

7. The method for manufacturing an SOI substrate according to claim 1, wherein at least one of nitrogen, oxygen, and carbon is added to the single crystal semiconductor substrate at the same time as the addition of hydrogen.

8. The method for manufacturing an SOI substrate according to claim 1, wherein a silicon nitride film, a silicon oxide film, a silicon oxynitride film, or a silicon nitride oxide film is formed over the semiconductor layer before the superficial part of the semiconductor layer is melted.

9. The method for manufacturing an SOI substrate according to claim 1, wherein a glass substrate is used as the base substrate.

10. A method for manufacturing a semiconductor device comprising a transistor which is formed using the SOI substrate according to claim 1.

11. A method for manufacturing an SOI substrate, comprising the steps of:
    adding hydrogen to a single crystal semiconductor substrate so that an embrittled region is formed in a region at a predetermined depth from a surface of the single crystal semiconductor substrate;
    bonding the single crystal semiconductor substrate to a base substrate with an insulating layer interposed therebetween;
    heating the single crystal semiconductor substrate to be separated along the embrittled region, whereby a semiconductor layer is provided over the base substrate with the insulating layer interposed therebetween; and
    melting at least a superficial part of the semiconductor layer,
    wherein nitrogen is added to the single crystal semiconductor substrate at the same time as the addition of hydrogen and to the semiconductor layer in the melting step, so that the semiconductor layer includes a region having a nitrogen concentration of $1\times10^{16}$ atoms/cm$^3$ or more, and
    wherein oxygen is added to the single crystal semiconductor substrate at the same time as the addition of hydrogen and to the semiconductor layer in the melting step, so that the semiconductor layer includes a region having an oxygen concentration of $2\times10^{18}$ atoms/cm$^3$ or more.

12. The method for manufacturing an SOI substrate, according to claim 11, wherein carbon is added to the single crystal semiconductor substrate at the same time as the addition of hydrogen, so that a concentration of carbon in the semiconductor layer is $1\times10^{17}$ atoms/cm$^3$ or more.

13. The method for manufacturing an SOI substrate, according to claim 11, wherein a glass substrate is used as the base substrate.

14. A method for manufacturing a semiconductor device comprising a transistor which is formed using the SOI substrate according to claim 11.

15. The method for manufacturing an SOI substrate according to claim 11, wherein melting is performed by irradiating the semiconductor layer with a laser beam.

16. The method for manufacturing an SOI substrate according to claim 11, wherein melting is performed by strong light irradiation with a lamp.

17. The method for manufacturing an SOI substrate according to claim 11, wherein the superficial part of the semiconductor layer is melted while being sprayed with a gas containing at least one of nitrogen, oxygen, and carbon.

18. The method for manufacturing an SOI substrate according to claim 11, wherein a silicon nitride film, a silicon oxide film, a silicon oxynitride film, or a silicon nitride oxide film is formed over the semiconductor layer before the superficial part of the semiconductor layer is melted.

* * * * *